United States Patent [19]
Nagata et al.

[11] Patent Number: 5,995,432
[45] Date of Patent: Nov. 30, 1999

[54] SEMICONDUCTOR MEMORY DEVICE HAVING N-CHANNEL MOS TRANSISTOR FOR PULLING UP PMOS SOURCES OF SENSE AMPLIFIERS

[75] Inventors: Kyoichi Nagata; Satoshi Isa, both of Tokyo, Japan

[73] Assignee: NEC Corporation, Tokyo, Japan

[21] Appl. No.: 09/127,866

[22] Filed: Aug. 3, 1998

[30] Foreign Application Priority Data

Aug. 1, 1997 [JP] Japan .................................. 9-207989

[51] Int. Cl.$^6$ ...................................................... G11C 7/00
[52] U.S. Cl. ....................................... 365/205; 365/230.03
[58] Field of Search ......................... 365/230.03, 230.06, 365/205

[56] References Cited

U.S. PATENT DOCUMENTS

| | | | |
|---|---|---|---|
| 5,831,924 | 11/1998 | Nitta et al. ........................... | 365/230.03 |
| 5,835,436 | 11/1998 | Ooishi ................................. | 365/230.03 |
| 5,875,149 | 2/1999 | Oh et al. .............................. | 365/230.06 |

FOREIGN PATENT DOCUMENTS

9-205182  8/1997  Japan .

OTHER PUBLICATIONS

M. Nakamura et al., "A 29–ns 64–Mb DRAM with Hierarchical Array Architecture", pp. 1302–1307, IEEE Journal of Solid–State Circuits, vol. 31, No. 9, Sep. 1996.

*Primary Examiner*—David Nelms
*Assistant Examiner*—M. Tran
*Attorney, Agent, or Firm*—Young & Thompson

[57] ABSTRACT

In a semiconductor memory device including a plurality of memory cells connected between sub word lines and bit lines, a plurality of sub word line driver columns for driving the sub word lines, and a plurality of sense amplifier columns for sensing voltages at the bit lines, a plurality of sense amplifier control circuits are provided at cross areas between the sub word line driver columns and the sense amplifier columns. A first sense amplifier control circuit is constructed by a CMOS circuit forming an interface between global input/output lines and local input/output lines. A second sense amplifier control circuit is constructed by an N-channel MOS circuit forming a pull down circuit for pulling down NMOS sources of flip-flops of the sense amplifier columns and a first pull up circuit for pulling up PMOS sources of the flip-flops of said sense amplifier columns. A third sense amplifier control circuit is constructed by a P-channel MOS circuit forming a second pull up circuit for pulling up the PMOS sources of the flip-flops of the sense amplifier columns.

28 Claims, 18 Drawing Sheets

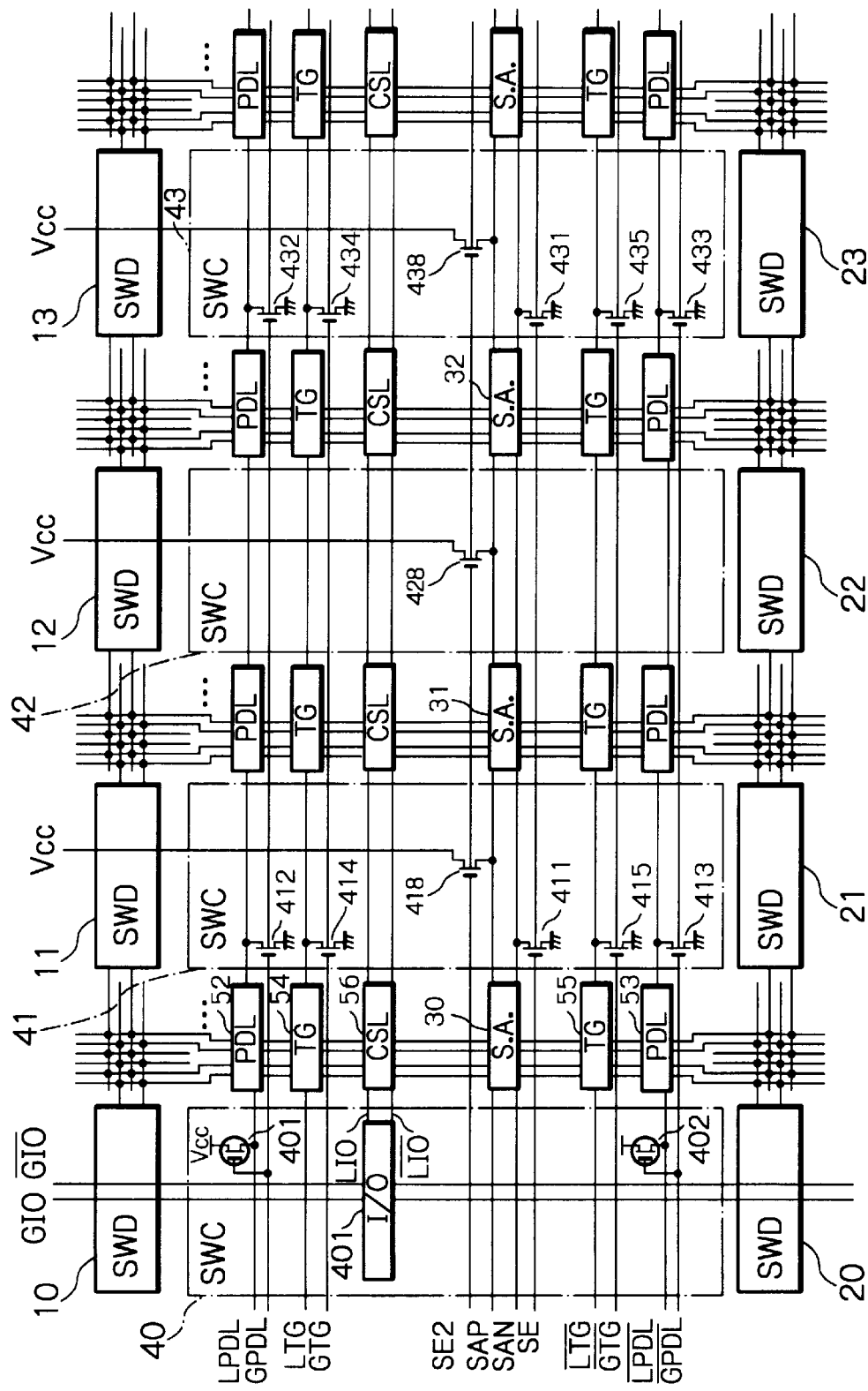

SEMICONDUCTOR MEMORY DEVICE HAVING N-CHANNEL MOS TRANSISTOR FOR PULLING UP PMOS SOURCES OF SENSE AMPLIFIERS

BACKGROUND OF THE INVENTION

1. Field of the Invention

The present invention relates to a semiconductor memory device, and more particularly, to a dynamic random access memory (DRAM) device

2. Description of the Related Art

As the integration of a DRAM device has been enhanced, a multi-divided array structure has been adopted. That is, a memory cell array is divided into a plurality of blocks, so that a plurality of sense amplifier columns and a plurality of sub word line driven columns are provided.

Provided at cross areas between the sub word line drivers and the sense amplifier columns are sense amplifier control circuits, each including a sense amplifier (SAP) driver for pulling up PMOS sources of flip-flops of the sense amplifier columns to a write voltage and a sense amplifier (SAN) driver for pulling down the NMOS sources of the flip-flops of the sense amplifier columns to a ground voltage. Since the SAP driver is constructed by a P-channel MOS transistor and the SAN driver is constructed by an N-channel MOS transistor, each of the sense amplifier control circuits needs a large PN isolation region for isolating a P-type well for the SAP driver and an N-type well for the SAN driver (see M. Nakamura et al., "A 29ns 64Mb DRAM with Hierachical Array Architecture", *IEEE Journal of Solid-State Circuits*, Vol. 31, No 9, pp. 1302–1307, September 1996).

In order to reduce the PN isolation region, a semiconductor memory device wherein each of the sense amplifier control circuits is constructed by a P-type well or an N-type well has been proposed (see Japanese Patent Application No. 8-10527 filed on Jan. 25, 1996 invented by Kyoiich NAGATA et al. and published as JP-A-9-205182 on Aug. 5, 1997). This will be explained later in detail.

In the above-proposed semiconductor memory device, however, since each of the SAP drivers are constructed by a P-channel NOS transistor, the driving capability of the SAP drivers is small. Note that the current supply capability of P-channel MOS transistors is generally smaller than that of N-channel MOS transistors. In addition, since the SAP drivers are provided only in the sense amplifier control circuits formed by P-channel MOS transistors the number of the SAP drivers is decreased, so that the driving capability of the SAP drivers is decreased. Thus, the restore operation speed is decreased.

SUMMARY OF THE INVENTION

It is an object of the present invention to increase the driving capability for pulling up the PMOS sources of flip-flops of sense amplifier columns, in a multi-divided array structured semiconductor memory device.

According to the present invention, in a semiconductor memory device including a plurality of memory cells connected between sub word lines and bit lines a plurality of sub word line driver columns for driving the sub word lines, and a plurality of sense amplifier columns for sensing voltages at the bit lines, a plurality of sense amplifier control circuits are provided at cross areas between the sub word line driver columns and the sense amplifier columns. A first sense amplifier control circuit is constructed by a CMOS circuit forming an interface between global input/output lines and local input/output lines. A second sense amplifier control circuit is constructed by an N-channel MOS circuit forming a SAN driver for pulling down NMOS sources of flip-flops of the sense amplifier columns and a first SAP driver for pulling up PMOS sources of the flip-flops of the sense amplifier columns. A third sense amplifier control circuit is constructed by a P-channel MOS circuit forming a second SAP driver for pulling up the PMOS sources of the flip-flops of the sense amplifier columns.

Thus, at least one of the SAP drivers is constructed by N-channel MOS transistors. Additionally, the SAP drivers are dispersed in the sense amplifier control circuits. This enhances the driving capability for pulling up the PMOS sources of flip-flops of the sense amplifier columns, thus increasing the restore operation speed.

BRIEF DESCRIPTION OF THE DRAWINGS

The present invention will be more clearly understood from the description as set forth below, with reference to the accompanying drawings, wherein:

FIG. 15 is a block circuit diagram illustrating a fourth embodiment of the semiconductor memory device according to the present invention;

DESCRIPTION OF THE PROFFERED EMBODIMENTS

Before the description of the preferred embodiments, a proposed semiconductor memory device will be explained with reference to FIGS. 1, 2, 3 and 4 (see Japanese Patent Application No. 8-10527 filed on Jan. 25, 1996 and published as JP-A-9-205182 on Aug. 5, 1997).

Figure 1:
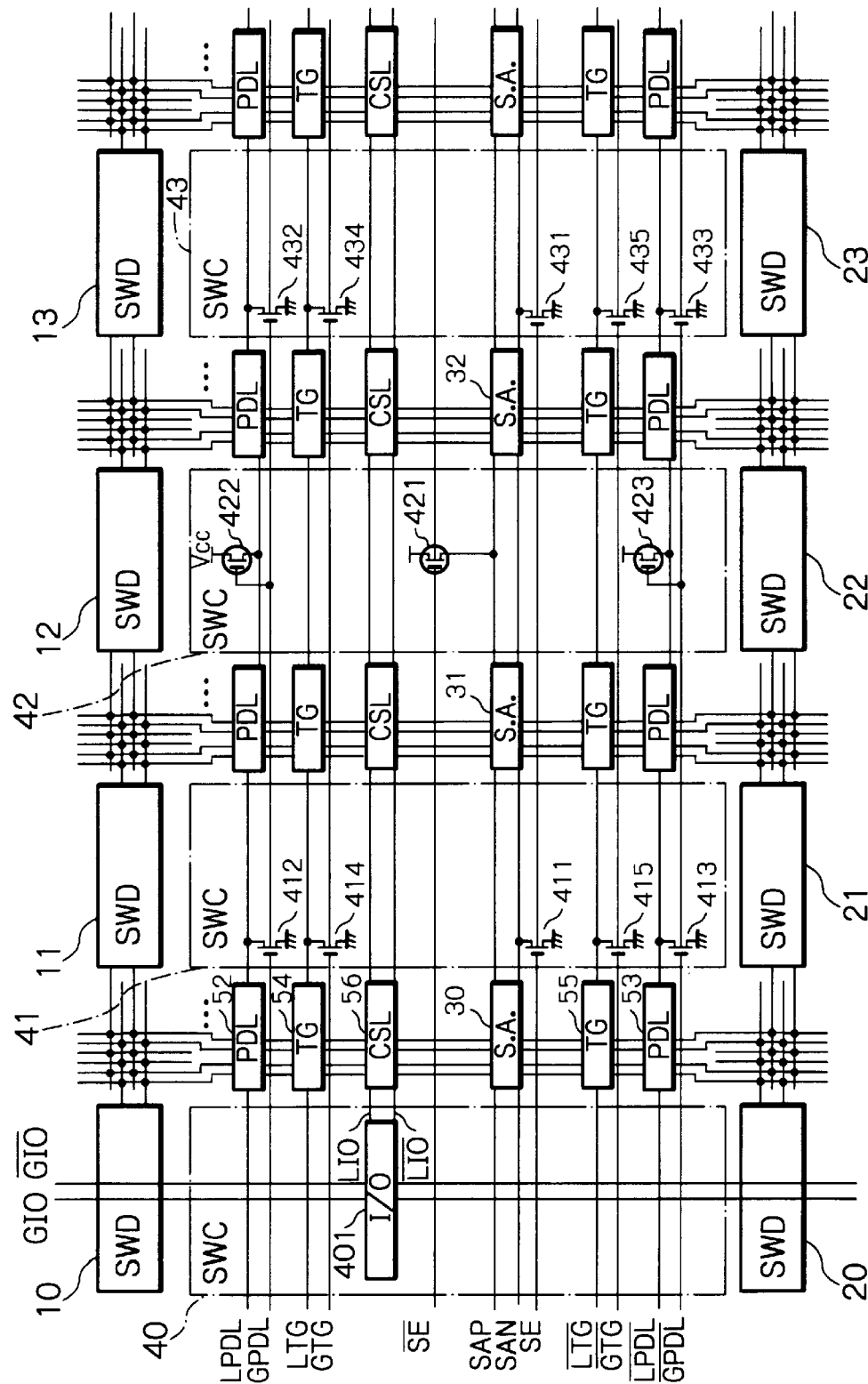
FIG. 1 is a block circuit diagram illustrating a proposed semiconductor memory device.

In FIG. 1, reference numerals 10, 11, 12, 13, 20, 21, 22 and 23 designate sub word line driver columns (SWD) each for driving a plurality of sub word lines SWL0, SWL1, . . . , SWL0', SWL1', . . . (shown not in FIG. 1, but in FIG. 2). Also, reference numerals 30, 31, 32 and 33 designate sense amplifier columns (SA) each including a plurality of sense amplifiers.

Provided among the sub word driver columns 10, 11, 12, 13, 20, 21, 22 and 23 and the sense amplifiers 30, 31, 32 and 33 are cross areas, i.e., sense amplifier control circuit areas (SWC) 40, 41, 42 and 43.

The sense amplifier control circuit area 40 is constructed by a CMOS circuit area, the sense amplifier control circuit area 41 is constructed by an N-channel MOS circuit area, the sense amplifier control circuit area 42 is constructed by a P-channel MOS circuit area, and the sense amplifier control circuit area 43 is constructed by an N-channel MOS transistor area.

Also, provided between a memory cell array 50 (shown not in FIG. 1, but in FIG. 2) and the sense amplifier column 30 are a bit line precharge circuit 52 enabled by a signal LPDL and a transfer gate circuit 54 enabled by a signal LTG. Similarly, provided between a memory cell array 51 (shown not in FIG. 1, but in FIG. 2) and the sense amplifier column 30 are a bit line precharge circuit 53 enabled by a signal $\overline{LPDL}$ and a transfer gate circuit 55 enabled by a signal $\overline{LTG}$. Further, a column selection switch circuit 56 enabled by a column selection signal CSL is connected between the sense amplifier column 30 and local input/output lines LIO and $\overline{LIO}$ and the sense amplifier column 30.

In the sense amplifier control circuit area 40, an input/output interface 401 is connected between the local input/output lines LIO and LIO and global input/output lines GIO and GIO.

In the sense amplifier control circuit area 41, the source voltage SAN of a flip-flop formed by cross-coupled N-channel MOS transistors of each sense amplifier of the sense amplifier column 30, 31, 32 and 33 is pulled down to a ground voltage GND by an N-channel MOS transistor 411 which is controlled by a sense enable signal SE. Also, a signal line of the signal LPDL for the bit line precharge circuits such as 52 is pulled down to the ground voltage GND by an N-channel MOS transistor 412 which is controlled by a signal GPDL. Similarly, a signal line of the signal $\overline{LPDL}$ for the bit line precharge circuits such as 52 is pulled down to the ground voltage GND by an N-cbannel NOS transistor 413 which is controlled by a signal $\overline{GPDL}$. Further, a signal line of the signal LTG for the transfer gate circuits such as 54 is pulled down to the ground voltage GND by an N-channel MOS transistor 414 which is control by a signal GTG . Similarly, a signal line of the signal $\overline{LTG}$ for the transfer gate circuits such as 55 is pulled down to the ground voltage GND by an N-channel MOS transistor 415 which is control by a signal $\overline{GTG}$.

In the sense amplifier control circuit area 42, the source voltage SAP of a flip-flop formed by cross-coupled P-channel MOS transistors of each sense amplifier of the sense amplifier column 30, 31, 32 and 33 is pulled up to a power supply voltage $V_{cc}$ by a P-channel MOS transistor 421 which is controlled by a sense enable signal $\overline{SE}$. Also, the signal line of the signal LPDL for the bit line precharge circuit such as 52 is pulled up to the power supply voltage $V_{cc}$ by a P-channel MOS transistor 422 which is also controlled by the signal GPDL. Similarly, the signal line of the signal $\overline{LPDL}$ for the bit line precharge circuits such as 52 is pulled up to the power voltage $V_{cc}$ by an N-channel MOS transistor 423 which is controlled by the signal $\overline{GPDL}$.

In the sense amplifier control circuit area 43, the source voltage SAN of a flip-flop formed by cross-coupled N-channel MOS transistors of each sense amplifier of the sense amplifier column 30, 31, 32 and 33 is pulled down to the ground voltage GND by an N-channel MOS transistor 431 which is controlled by the sense enable signal SE. Also, the signal line of the signal LPDL for the bit line precharge circuits such as 52 is pulled down to the ground voltage GND by an N-channel MOS transistor 432 which is controlled by a signal GPDL. Similarly, the signal line of the signal $\overline{LPDL}$ for the bit line precharge circuits such as 52 is pulled down to the ground voltage GND by an N-channel MOS transistor 433 which is controlled by the signal $\overline{GPDL}$. Further, the signal line of the signal LTG for the transfer gate circuits such as 54 is pulled down to the ground voltage GND by an N-channel MOS transistor 434 which is controlled by the signal GTG. Similarly, the signal line of the signal $\overline{LTG}$ for the transfer gate circuits such as 55 is pulled down to the ground voltage GND by an N-channel MOS transistor 435 which is control by the signal $\overline{GTG}$.

Figure 2:
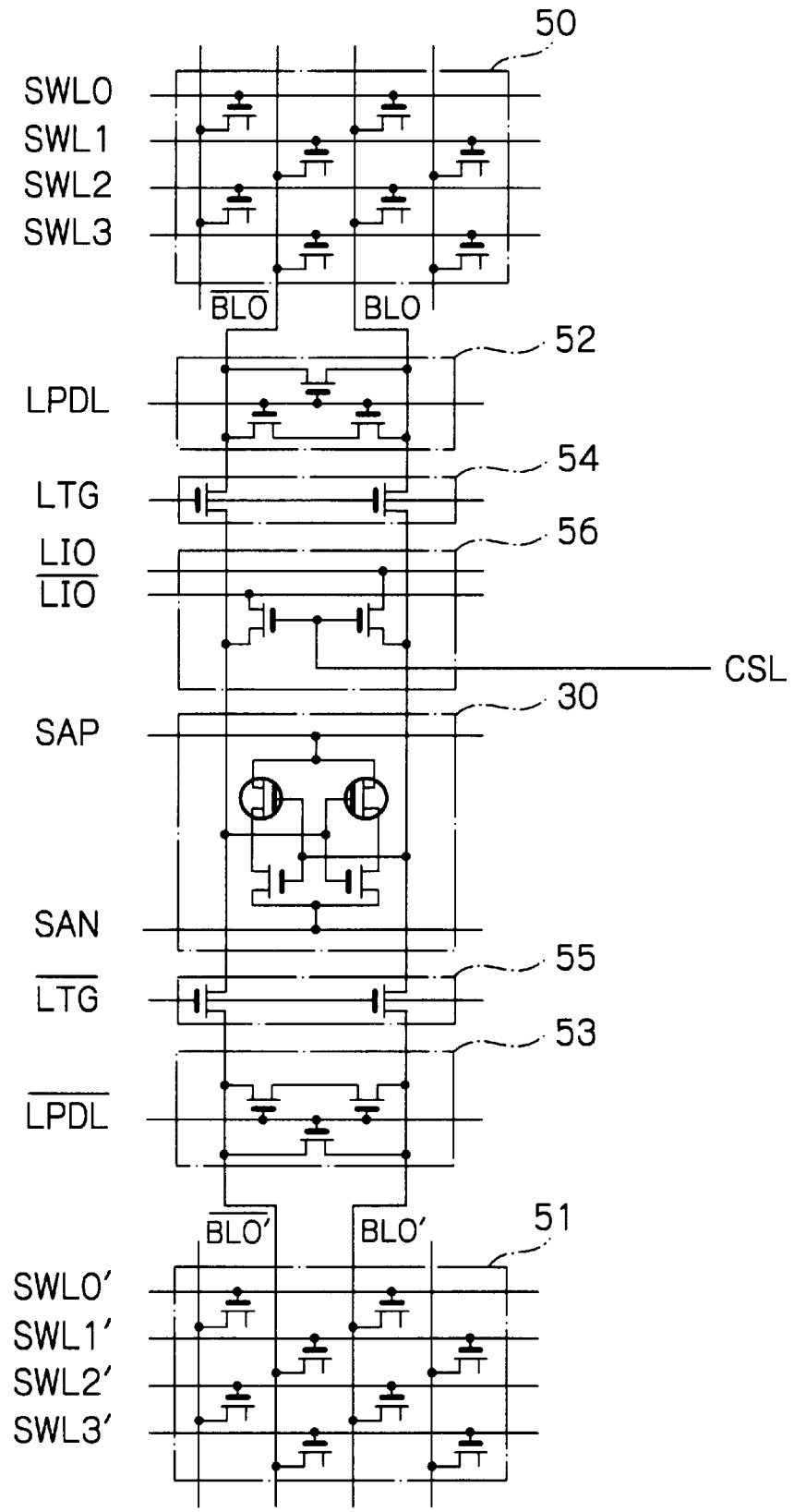
FIG. 2 is a partial circuit diagram of the device of FIG. 1.
Figure 3:
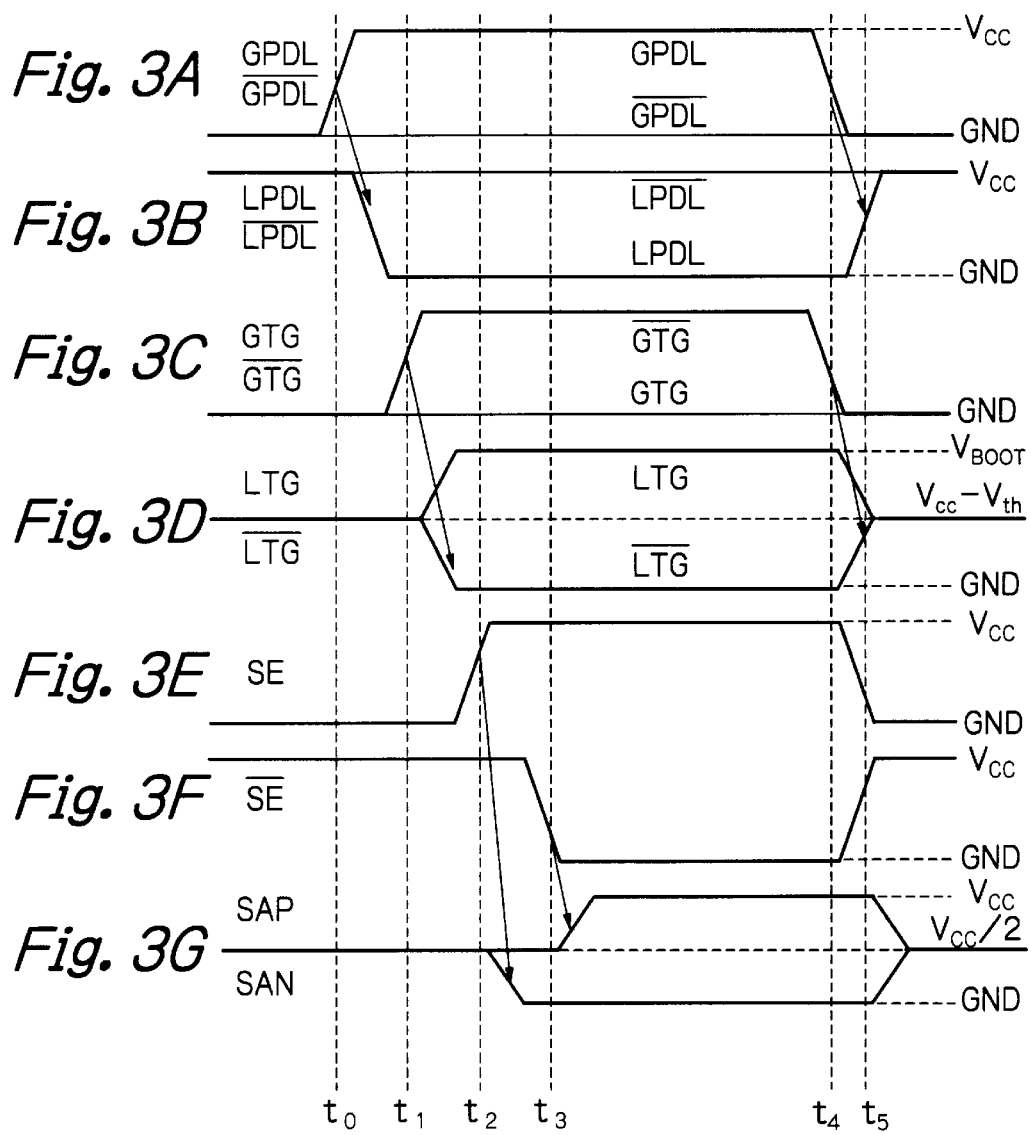
FIGS. 3A through 3G are timing diagrams for showing the operation of the device of FIGS. 1 and 2.

In FIG. 2, note that only one column is illustrated for simplifying the description; actually, a plurality of columns are included in each of the circuits of FIG. 2.

The device of FIGS. 1 and 2 is explained next with reference to FIGS. 3A through 3G.

Initially, as shown in FIG. 3A, the signals $\overline{GPDL}$ and $\overline{GPDL}$ are both low, so that the transistors 422 and 423 are turned ON, and the transistors 412, 413, 432 and 433 are turned OFF. As a result, the signals LPDL and $\overline{LPDL}$ are both at $V_{cc}$, and therefore the bit lines such as BL0 and $\overline{BL0}$ (BL0' and $\overline{BL0}$') are precharged at an in intermediate level between GND and $V_{cc}$.

Next, assume that the sub word driver columns 10, 11, 12 and 13 on the upper side are selected. Then, at time t0, as shown in FIG. 3A, the signal GPDL rises, so that the transistors 412 and 432 are turned ON and the transistor 422 is turned OFF. Therefore, as shown in FIG. 3B, the signal LPDL becomes low to complete the precharging operation for the bit line precharge circuits such as 52 on the upper side.

Next, at time t1, as shown in FIG. 3C, the signal $\overline{GTG}$ rises to turn ON the transistors 411 and 431. As a result, as shown in FIG. 3D, the signal $\overline{LTG}$ is changed from $V_{cc}-V_{th}$ to the ground voltage GND, so that the N-channel MOS transistors of the transfer gate circuits such as 55 on the lower side are turned OFF. Here, $V_{th}$ is a threshold voltage of the N-channel MOS transistors. Thus, the non-selected bit lines on the lower side are electrically separated from the sense amplifier columns 30, 31, 32 and 33.

On the other hand, simultaneously, as shown in FIG. 3D, the LTG is changed from $V_{cc}-V_{th}$ to $V_{BOOT}$ ($>V_{cc}+V_{th}$). As a result, the N-channel MOS transistors of the transfer gate circuits such as 54 are turned ON. Thus, the selected bit lines on the upper side are electrically connected to the sense amplifier columns 30, 31, 32 and 33.

Next, at time t2, as shown in FIG. 3E, the sense enable signal $\overline{SE}$ rises to turn ON the transistors 411 and 431, to pull down the voltage SAN from $V_{cc}/2$ to the ground voltage GND, thus starting a sense operation, as shown in FIG. 3G.

Next, at time t3, as shown in FIG. 3F, the sense enable signal SE falls to turn ON the transistor 421, to pull up the voltage SAP from $V_{cc}/2$ to the power supply voltage $V_{cc}$, thus starting a restore operation, as shown in FIG. 3G.

Next, at time t4, as shown in FIG. 3A, the signal GPDL falls, so that the transistors 412 and 432 are turned OFF and the transistor 422 is turned ON. Therefore, as shown in FIG. 3B, the signal LPDL becomes high to start a precharging operation for the bit line precharge circuits such as 52 on the upper side.

Also, at time t4, as shown in FIG. 3C, the signal $\overline{GTG}$ falls to turn OFF the transistors 411 and 431. As a result, as shown in FIG. 3D, the signal $\overline{LTG}$ is changed from low to $V_{cc}-V_{th}$.

On the other hand, simultaneously, as shown in FIG. 3D, the LTG is changed from $V_{BOOT}$ to $V_{cc}-V_{th}$.

Next, at time t5, as shown in FIG. 3E, the sense enable signal $\overline{SE}$ falls to turn OFF the transistors 411 and 431. Simultaneously, as shown in FIG. 3F, the sense enable signal SE falls to turn OFF the transistor 421. Thus, the sense and restore operation is completed, and the voltages SAN and SAP are caused to be $V_{cc}/2$.

Figure 4:
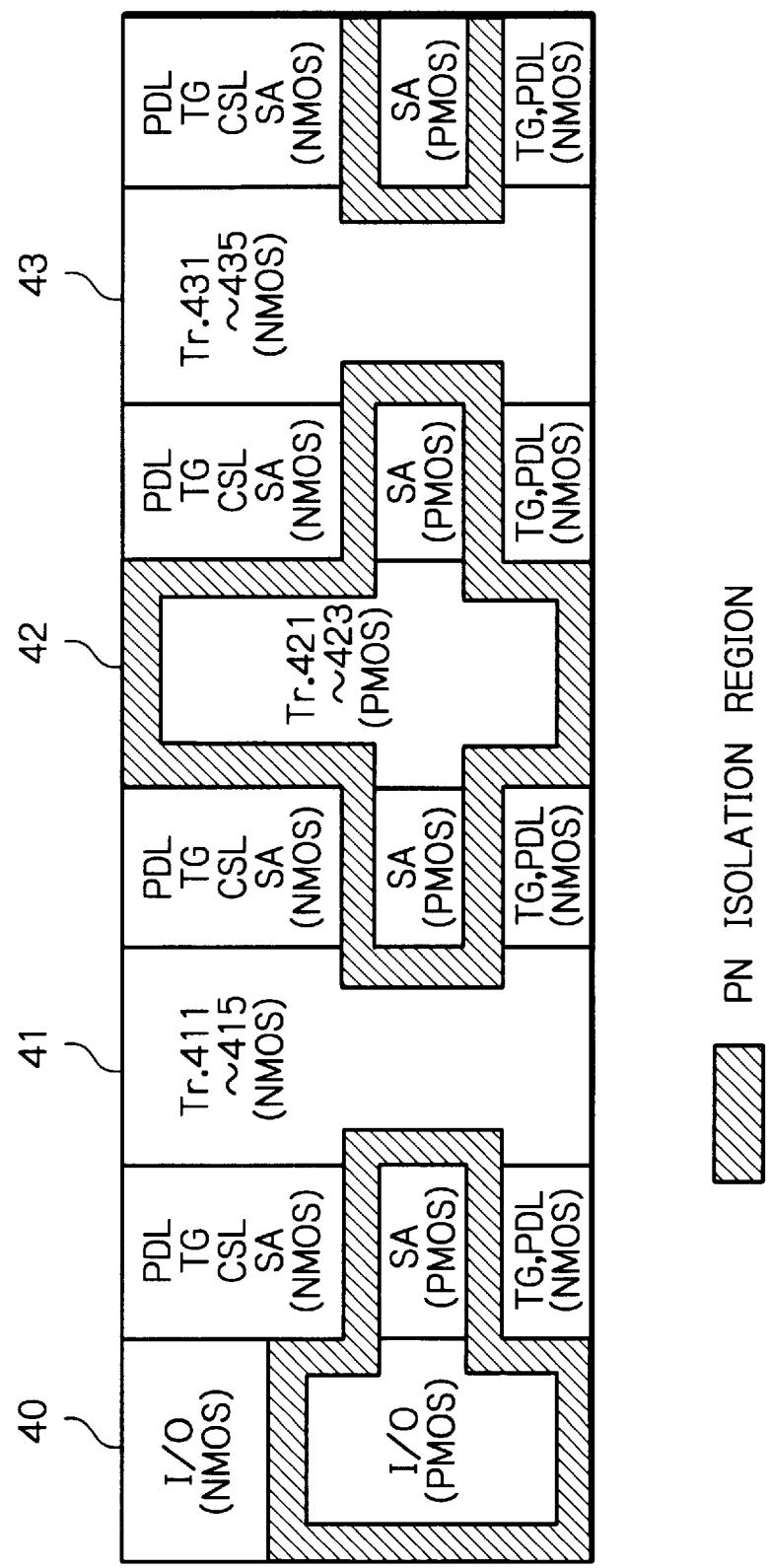
FIG. 4 is a layout diagram of the device of FIG. 1.

In FIG. 4, which is a layout diagram of the device of FIG. 1. a P-well region and an N-well region are isolated by a PN isolation region. That is, the sense amplifier control circuit areas 40, 41, 42 and 43 are divided into three kinds of circuit areas. In other words, the sense amplifier control circuit area 40 is constructed by the p-well region and the N-well region. The sense amplifier control circuit areas 41 and 43 are constructed by only the N-well region. The sense amplifier control circuit area 42 is constructed by only the P-well region. Therefore, the area of the PN isolation region can be minimum. Also, the sense amplifier control circuit areas 40, 41, 42 and 43 can be reduced in size. Further, the transistors of the sense amplifier columns 30, 31, 32 and 33 can be increased in size, thus enhancing the sense and restore operation speed.

In the device of FIG. 1, the sense amplifier columns 30 and 31 are driven by the N-channel MOS transistor 411 as an SAN driver, and the sense amplifier columns 32 and 33 are driven by the N-channel MOS transistor 431 as an SAN driver. Therefore, even when the number of memory cells is increased to increase the distance between the sense amplifier columns 30 and 31 (32 and 33) the parasitic resistance and capacitance of the lines between the SAN driver 411 (431) and the sense amplifier columns 30 and 31 (32 and 33) are not so large, and therefore the sense operation speed is not so reduced.

On the other hand, all the sense amplifier columns 30, 31, 32 and 33 are driven by the P-channel MOS transistor 421 as an SAP driver. Therefore, when the number of memory cells is increased to increase the distance between the sense amplifier columns, the parasitic resistance and capacitance of the lines between the SAP driver 421 and the sense amplifier columns, particularly, the sense amplifier columns 30 and 33 far away from the SAP driver become so large that the restore operation speed by the sense amplifier columns 30 and 33 is remarkably reduced.

Figure 5:
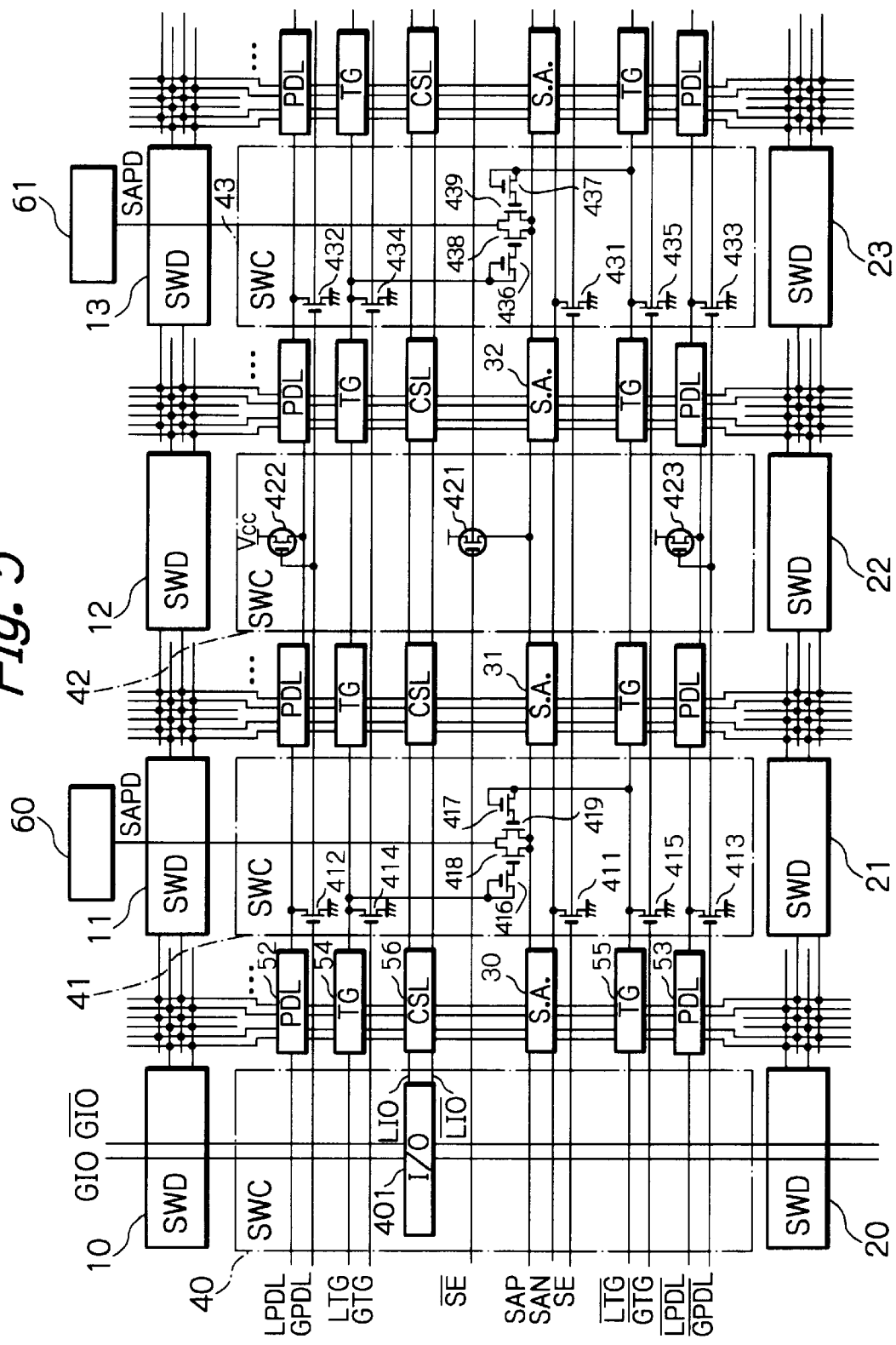
FIG. 5 is a block circuit diagram illustrating a first embodiment of the semiconductor memory device according to the present invention.

In FIG. 5, which illustrates a first embodiment of the present invention, a SAP drive circuit formed by N-channel MOS transistors 416, 417, 418 and 419 is added in the sense amplifier control circuit area 41, and a SAP drive circuit formed by N-channel MOS transistors 436, 437, 438 and 439 is added in the sense amplifier control circuit area 43. The sources of the transistors 418 and 419 (438 and 439) are connected to the line of the signal SAP, and the drains of the transistors 418 and 419 (438 and 439) are connected to a power supply circuit 60 (61). The gates of the transistors 418 and 419 (438 and 439) are controlled by the sources of the transistors 416 and 417 (436 and 437), respectively. That is, the transistors 416 and 417 (436 and 437) are used for self-booting the gate voltages of the transistors 418 and 419 (438 and 439), respectively. In this case, the signal LTG is supplied as a step-up signal to the gate and drain of the transistor 416 (436), and the signal $\overline{LTG}$ is supplied as a step-up signal to the gate and drain of the transistor 417 (436).

Figure 6:
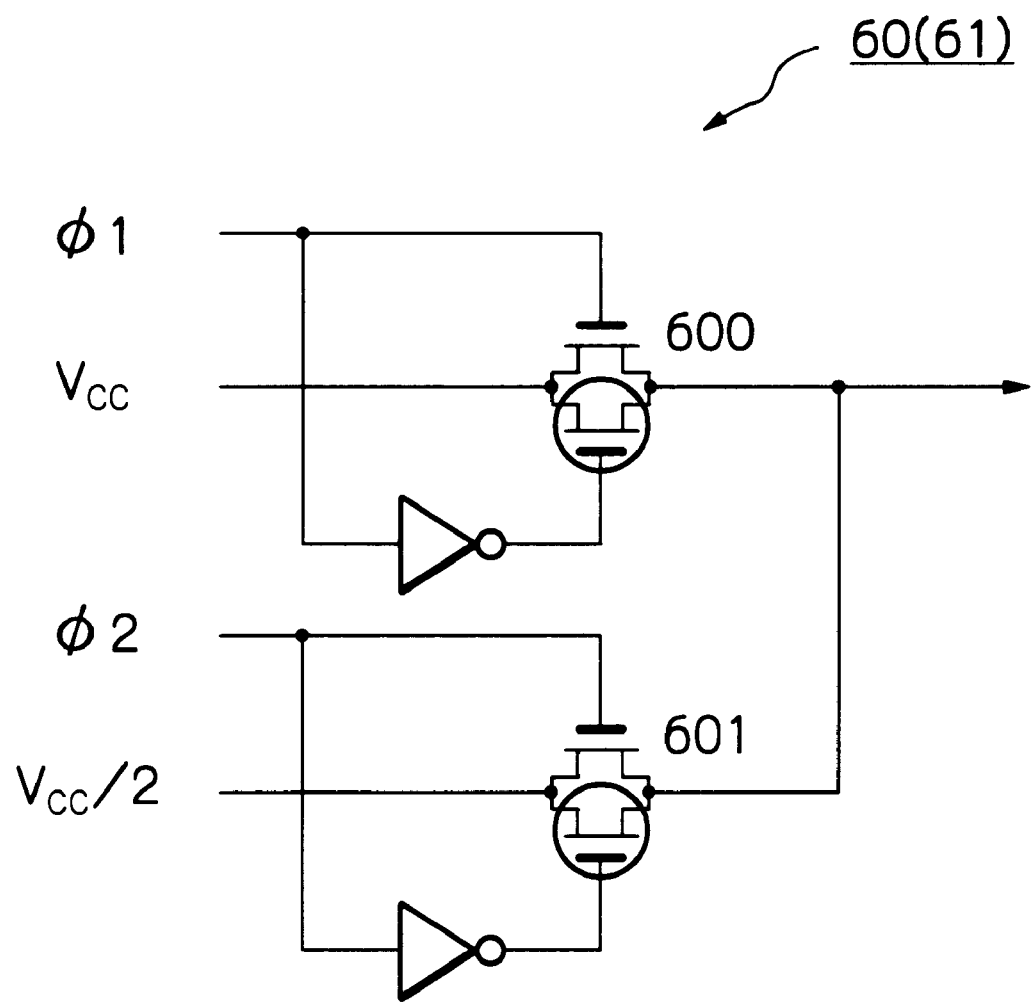
FIG. 6 is a detailed circuit diagram of the power supply circuit of FIG. 5.

In FIG. 6, which is a detailed circuit diagram of the power supply circuit 60 (61) of FIG. 5, a CMOS transfer gate 600 passes the power supply voltage $V_{cc}$ as a signal SAPD therethrough in response to a control signal $\phi 1$, a CMOS transfer gate 601 passes the voltage $V_{cc}/2$ therethrough as a signal SAPD in response to a control signal $\phi 2$.

The device of FIGS. 5 and 6 is explained next with reference to FIGS. 7A through 7G. Note that the signals GPDL, $\overline{GPDL}$, LPDL and $\overline{LPDL}$ are changed in the same way as in FIGS. 3A and 3B.

Figure 7:
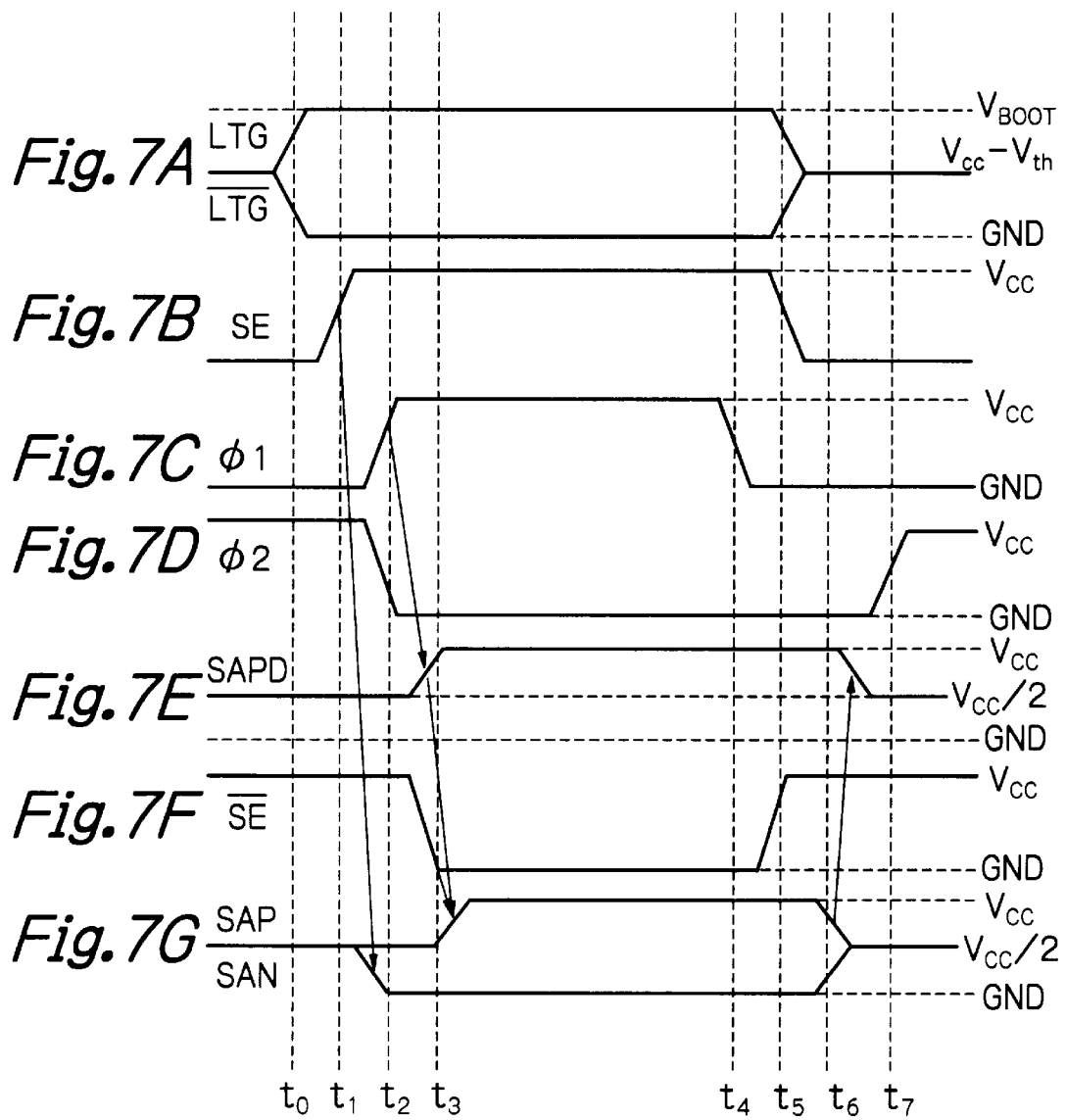
FIGS. 7A through 7G are timing diagrams for showing the operation of the device of FIGS. 5 and 6.

Assume that the sub word driver columns 10, 11, 12 and 13 on the upper side are selected. Then, at time t0, as shown in FIG. 7A, the signal $\overline{LTG}$ is changed from $V_{cc}-V_{th}$ to the ground voltage GND, so that the N-channel MOS transistors of the transfer gate circuits such as 55 on the lower side are turned OFF. Here, $V_{th}$ is a threshold voltage of the N-channel MOS transistors. Thus, the non-selected bit lines on the lower side are electrically separated from the sense amplifier columns 30, 31, 32 and 33.

On the other hand, simultaneously, as shown in FIG. 7A, the signal LTG is changed from $V_{cc}-V_{th}$ to $V_{BOOT}$. As a result, the N-channel MOS transistors of the transfer gate circuits such as 54 are turned ON. Thus, the selected bit lines on the upper side are electrically connected to the sense amplifier columns 30, 31, 32 and 33.

Next, at time t1, as shown in FIG. 7B, the sense enable signal SE rises to turn ON the transistors 411 and 431, to pull down the voltage SAN from $V_{cc}/2$ to the ground voltage GND, thus starting a sense operation, as shown in FIG. 7G.

Next, at time t2, as shown in FIG. 7C, the control signal $\phi 1$ rises, and the control signal $\phi 2$ falls. As a result, at time t3, as shown in FIG. 7F, the voltage of the power supply circuit 60 (61) is changed from $V_{cc}/2$ to $V_{cc}$. Therefore, the signal SAP is pulled up to $V_{cc}$ by the self-boot effect of the transistor 416 (436).

Also, at time t3, as shown in FIG. 7F, the sense enable signal $\overline{SE}$ falls to turn ON the transistors 421, to pull up the voltage SAP from $V_{cc}/2$ to the power supply voltage $V_{cc}$, thus starting a restore operation, as shown in FIG. 7G.

Next, at time t4, in order to deactivate the sense amplifier columns 30, 31, 32 and 33, as shown in FIG. 7C, the control signal $\phi 1$ falls.

Next, at time t5, as shown in FIG. 7A, the signals LTG and $\overline{LTG}$ are precharged at $V_{cc}-V_{th}$ and as shown in FIG. 7B, the sense enable signal SE falls. Also, as shown in FIG. 7F, the sense enable signal $\overline{SE}$ rises.

Next, at time t6, as shown in FIG. 7G, the signals SAP and SAN are precharged at $V_{cc}/2$. Also, as shown in FIG. 7E, the signal SAPD falls.

Finally, at time t7, the control signal $\phi 2$ rises.

Figure 8:
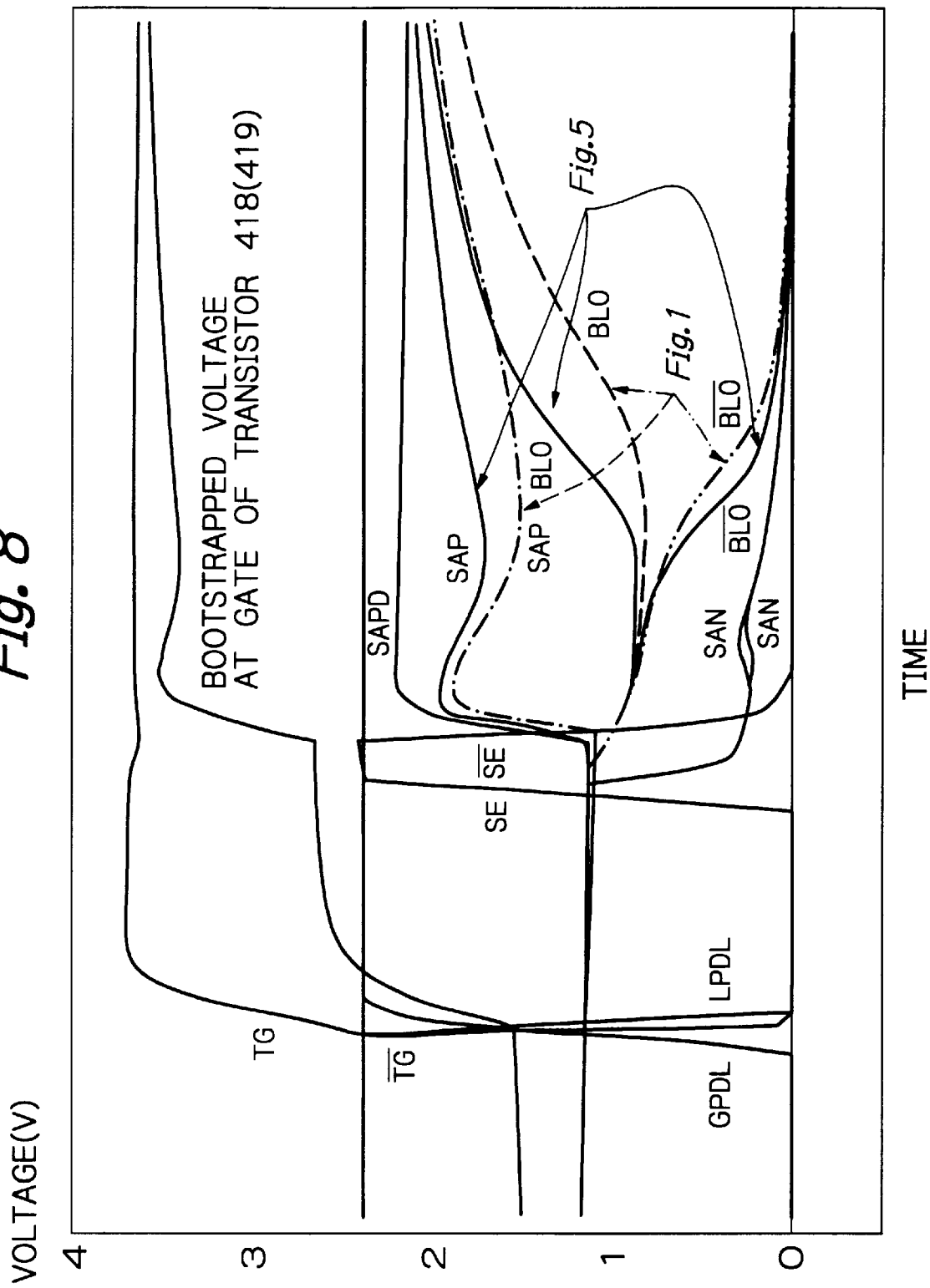
FIG. 8 is a timing diagram for showing a simulation result of the device of FIG. 5.

FIG. 8 is a timing diagram obtained by performing a simulation upon the device of FIGS. 1 and 5. That is, the recovery of the signal SAP is more rapid in FIG. 5 than in FIG. 1. Thus, the restore operation speed of the bit line BL0 is increased to rapidly increase the voltage at the bit line BL0. Therefore, due to the rapid rise of the voltage at the bit line BL0, the operation speed of the N-channel MOS transistor type flip-flop is increased to rapidly decrease the voltage $\overline{BL0}$.

Thus, in the first embodiment of FIG. 5, since the line of the signal SAP is driven by three SAP drivers, i.e., a SAP driver formed by the transistors 416 to 419, a SAP driver formed by the transistor 421 and a SAP driver formed by the transistors 436 to 439, only two of the sense amplifier columns 30, 31, 32 and 33 are driven by each SAP driver, which decreases the parasitic resistance and capacitance of the line of the SAP for one SAP driver. As a result, the restore operation speed can be increased. In addition, although each of the SAP driver formed by the transistors 416 to 419 and the SAP driver formed by the transistor 436 to 439 requires a large driving power, such a large driving power can be attained by adopting bootstrap circuits formed by the transistors 416 and 417 (436 and 437) to rapidly increase the voltage of the signal SAPD. This further increases the restore operation speed.

Figure 9:
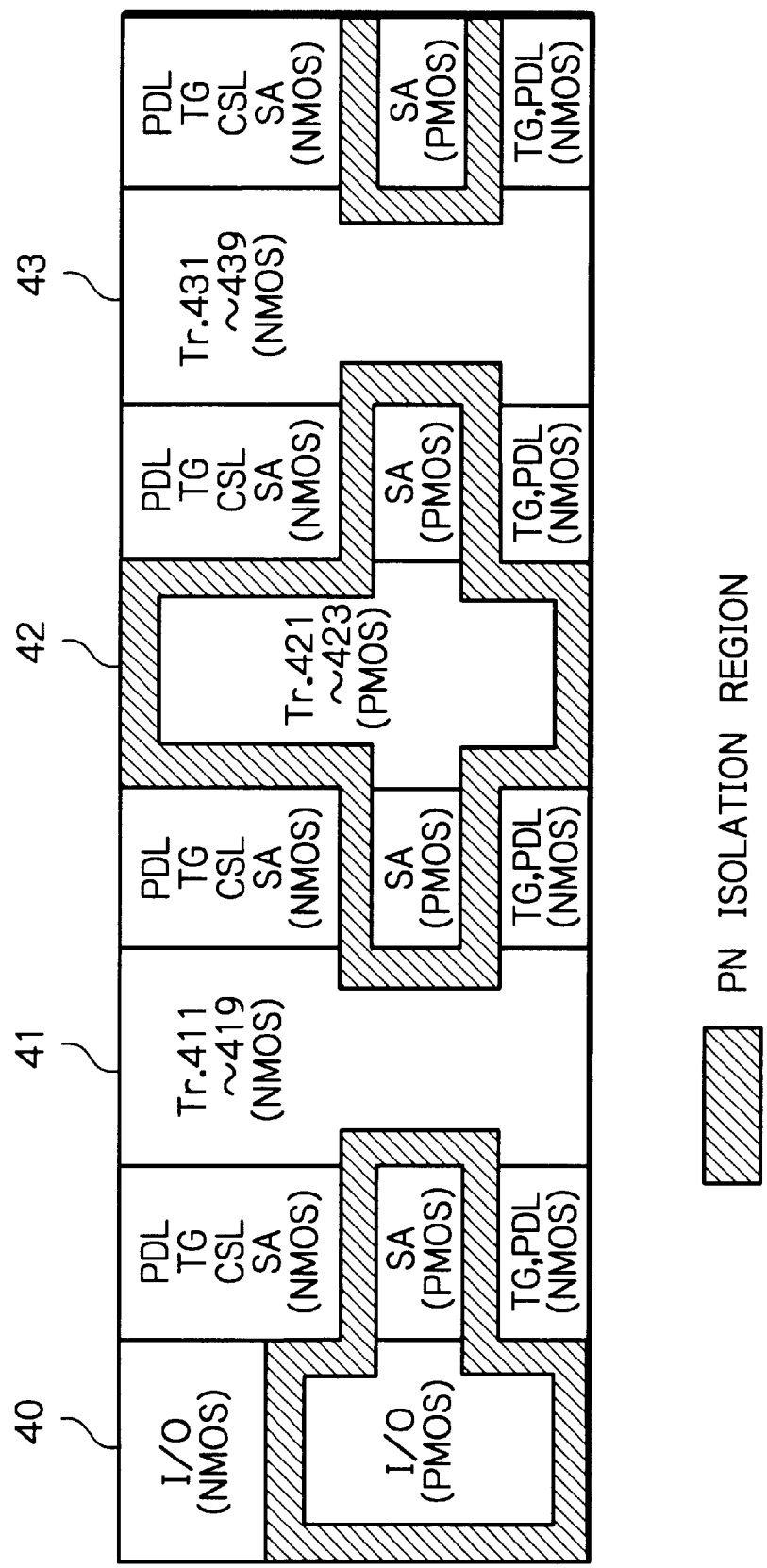
FIG. 9 is a layout diagram of the device of FIG. 5.

In FIG. 9, which is a layout diagram of the device of FIGS. 5, since the SAP driver (416 to 419) is constructed by N-channel MOS transistors formed within the sense amplifier circuit area 41 and the SAP driver (436 to 439) is constructed by N-channel MOS transistors within the sense amplifier circuit area 43, the layout of FIG. 9 is approximately the same as that of FIG. 4. Therefore, the area of the PN isolation region can be minimum.

Figure 10:
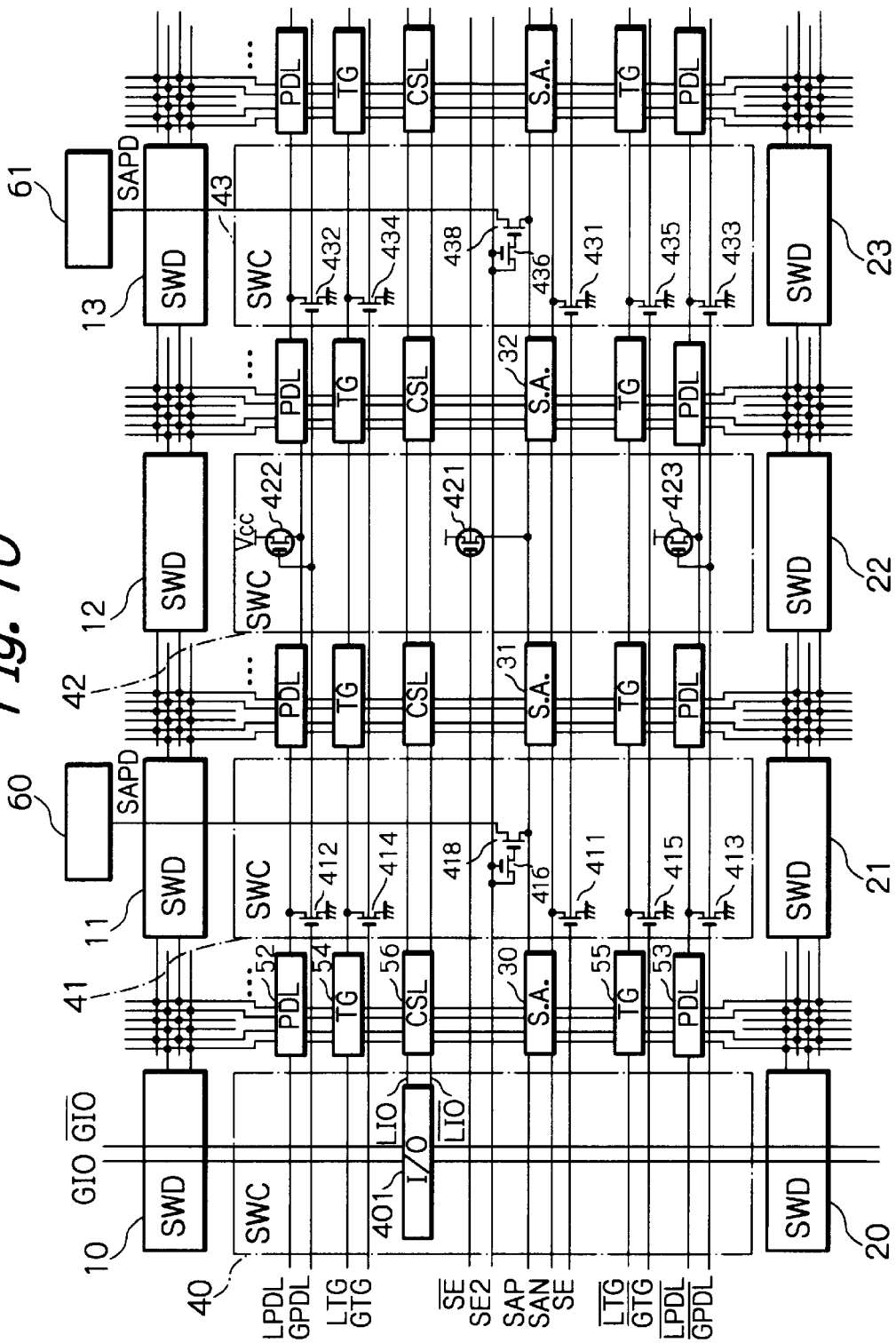
FIG. 10 is a block circuit diagram illustrating a second embodiment of the semiconductor memory device according to the present invention.

In FIG. 10, which illustrates a second embodiment of the present invention, the transistors 417 and 419 (437 and 439) of FIG. 5 are omitted, and the drain and gate of the transistor 416 (436) is controlled by a signal SE2. When the sense amplifier columns 30, 31, 32 and 33 are activated, the signal SE2 is pulled up to $V_{BOOT}$. On the other hand, when the sense amplifier columns 30, 31, 32 and 33 are deactivated, the signal SE2 is pulled down to GND. The operation of the device of FIG. 10 is about the same as that of the device of FIG. 5.

Thus, in the second embodiment, since the transistors 417 and 419 (437 and 439) of FIG. 5 are unnecessary, the device of FIG. 10 is advantageous over the device of FIGS. 5 in view of the chip size.

Figure 11:
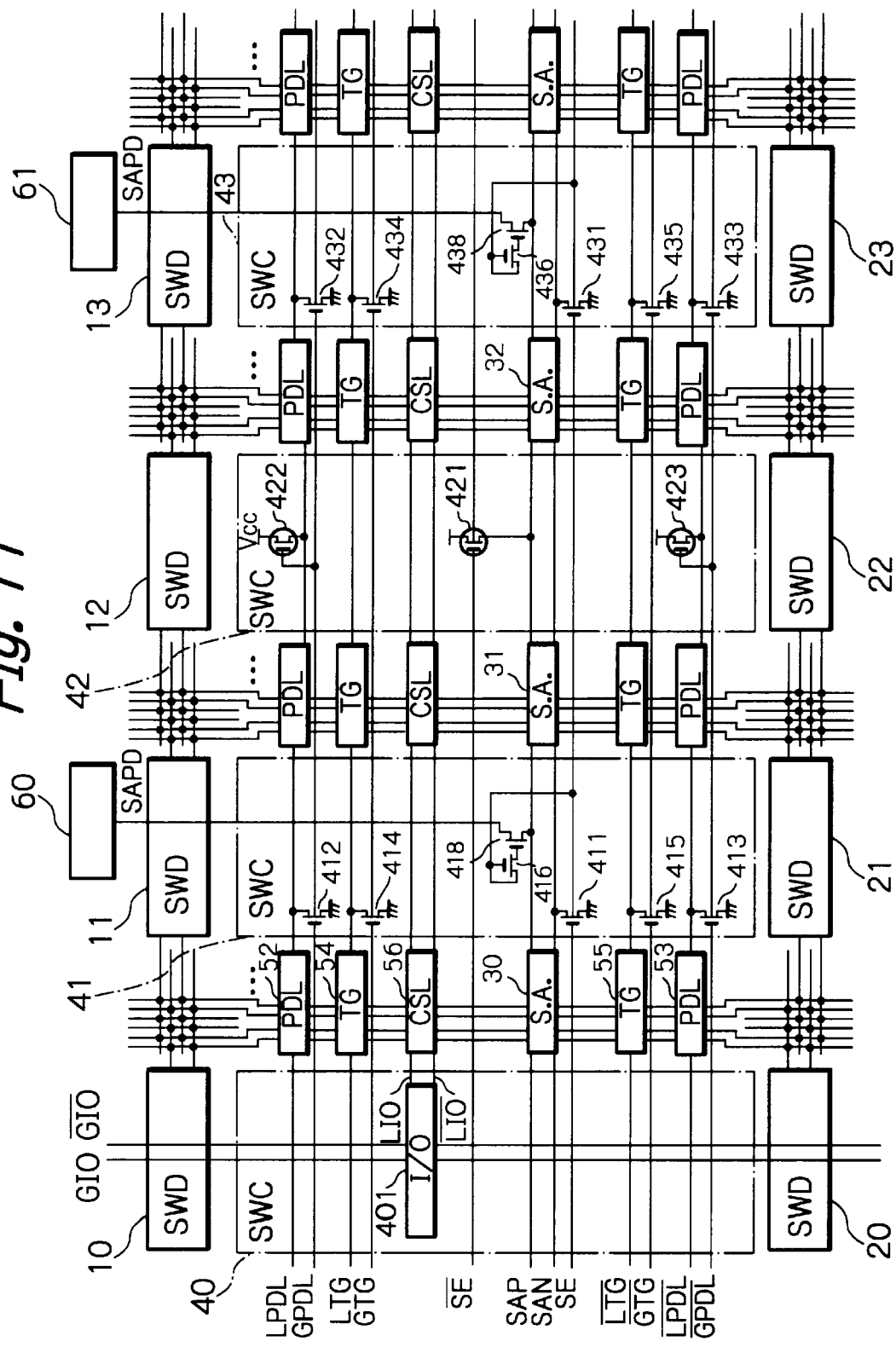
FIG. 11 is a block circuit diagram illustrating an modification of the device of FIG. 10.

Note that the signal SE instead of the signal SE2 of FIG. 10 is used as illustrated in FIG. 11. In this case, the high level of the signal SE is $V_{BOOT}$. Since the line of the signal SE2 is unnecessary, the device of FIG. 11 is advantageous over the device of FIG. 10 in view of the chip size.

Figure 12:
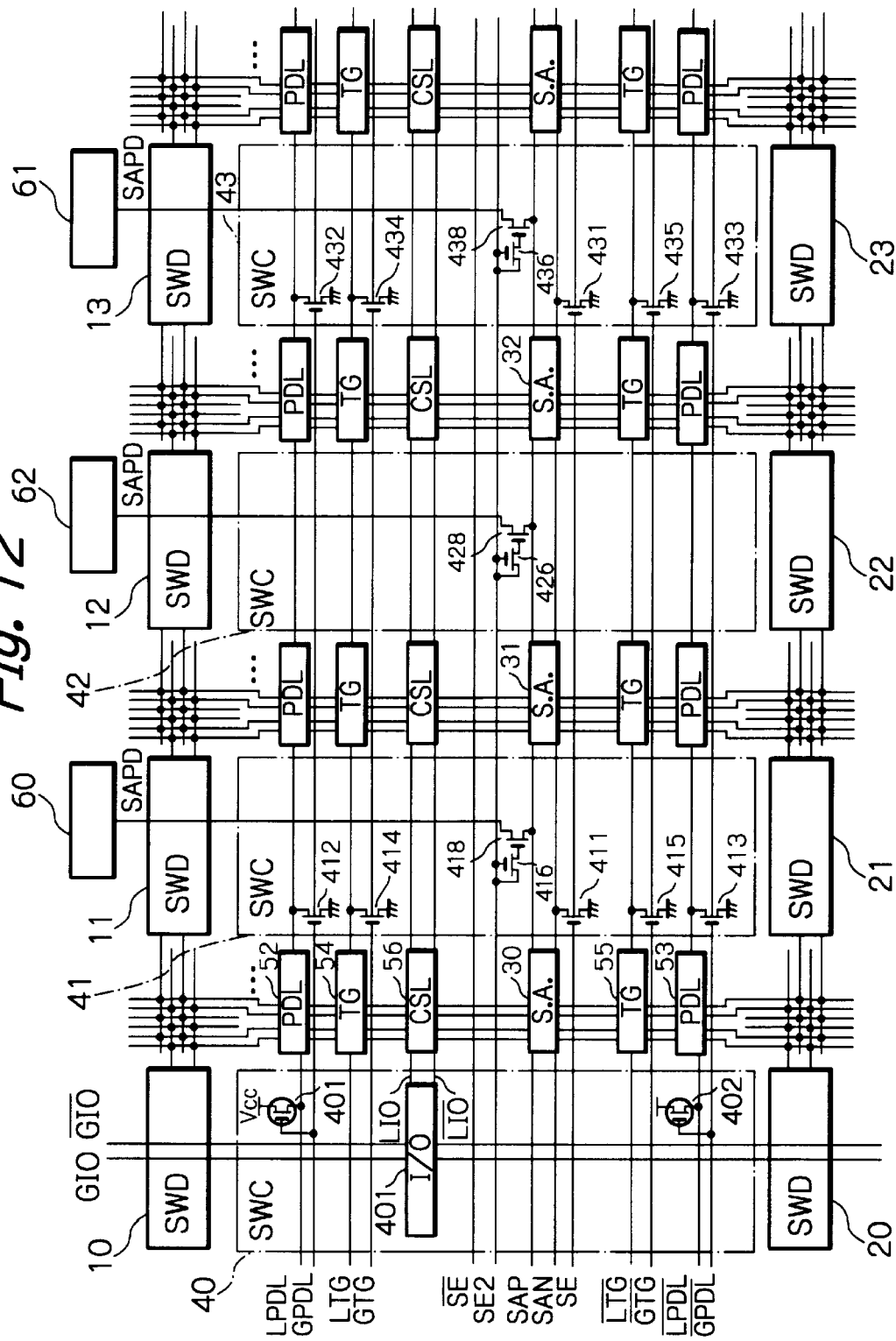
FIG. 12 is a block circuit diagram illustrating a third embodiment of the semiconductor memory device according to the present invention.
Figure 13:
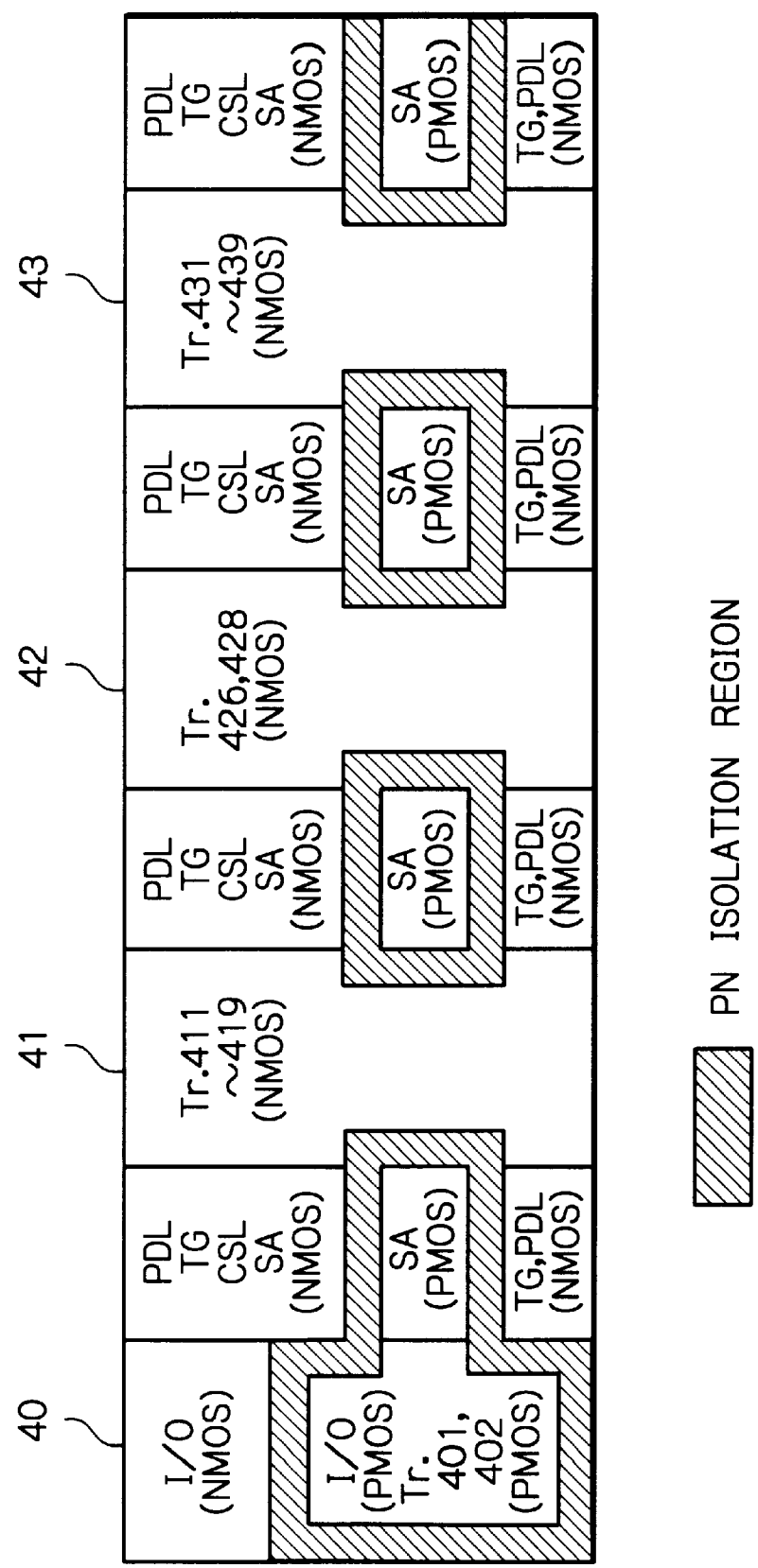
FIG. 13 is a layout diagram of the device of FIG. 12.

In FIG. 12, which illustrates a third embodiment of the present invention, the P-channel MOS transistors 422 and 423 of FIG. 10 are omitted from the sense amplifier control circuit area 42, and instead of this, P-channel MOS transistors 401 and 402 are provided in the sense amplifier control circuit area 40 of FIG. 10. Also, the SAP driver formed by the P-channel MOS transistor 421 of FIG. 10 is replaced by a SAP driver formed by N-channel MOS transistors 426 and 428 which have the same configuration as the transistors 416 and 418 (436 and 438). Therefore, the sense amplifier control circuit area 42 is constructed by an N-channel MOS circuit area as shown in FIG. 13.

Note that the drain of the transistor 428 is connected to a power supply circuit 62 which has the same configuration as the power supply circuits 60 and 61.

The operation of the device of FIG. 12 is about the same as that of FIG. 10. However, since an N-channel MOS transistor has a driving capability twice that of a P-channel MOS transistor, the driving capability of the SAP driver formed by the transistor 426 and 428 of FIG. 12 is twice as large as that of the SAP driver formed by the transistor 421 of FIG. 10.

Figure 14A:
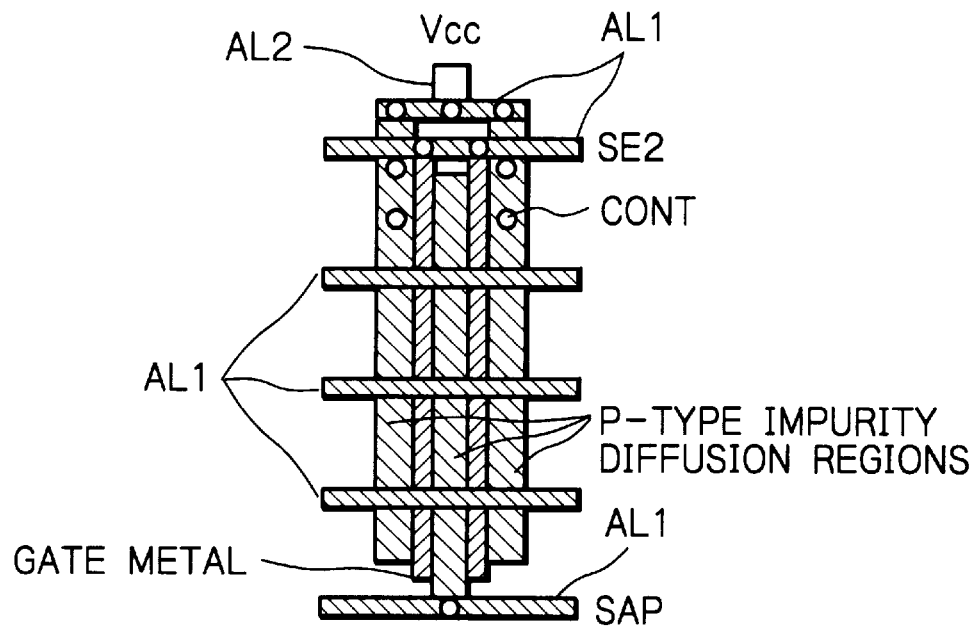
FIGS. 14A and 14B are layout diagrams of the P-channel MOS transistor and the N-channel MOS transistor of FIGS. 10 and 12, respectively.
Figure 14B:
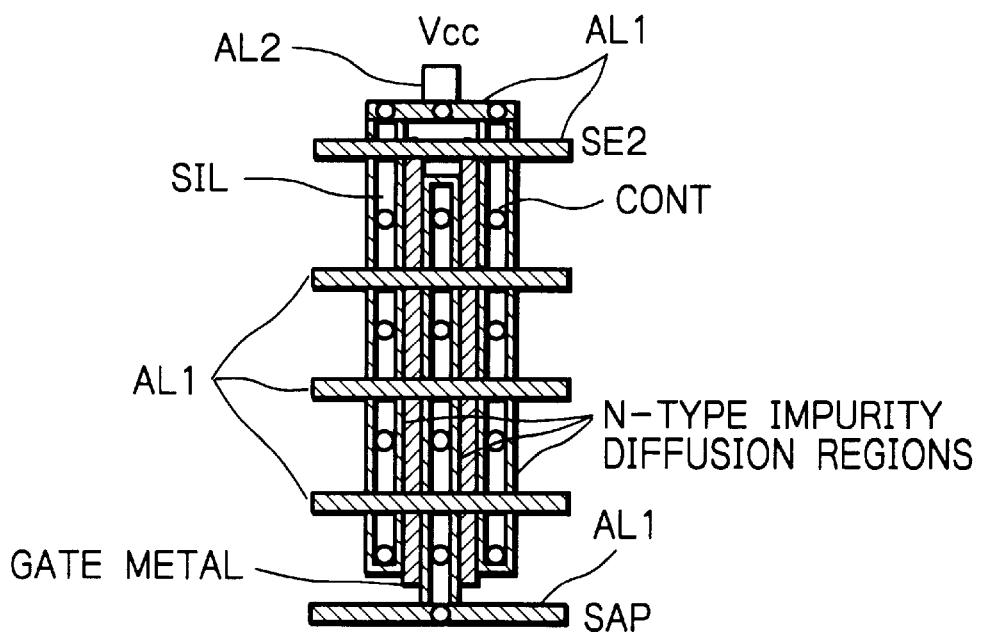

Additionally, the N-channel MOS transistors 426 and 428 of FIG. 12 are advantageous over the P-channel MOS transistor 421 of FIG. 10 in view of the layout. For example, in the case of the P-channel MOS transistor 421 of FIG. 10, as illustrated in FIG. 14A, P-type impurity diffusion regions cannot be in contact with a silicide layer (not shown), and the P-type impurity diffusions are in contact with only a line of the signal SE2 made of a first aluminum layer AL1, since impurities are diffused into the silicide layer to increase the resistance of the silicide layer. In addition, it is impossible to form many contact holes CONT on the P-type impurity regions due to the presence of other aluminum layers AL1, which also substantially increases the resistance of the P-type impurity diffusion regions. In FIG. 14A, AL2 designates a second aluminum layer, and G designates a gate metal layer. On the other hand, in the case of the N-channel MOS transistors 426 and 428 of FIG. 12, as shown in FIG. 14B, N-type impurity diffusion regions can be in contact with a silicide layer SIL via contact holes CONT, which substantially decrease the resistance of the N-type impurity diffusion regions. Thus, the SAP driver formed by the N-channel MOS transistors 426 and 428 has a larger current supply capability than the SAP driver formed by the P-channel MOS transistor 421 of FIG. 10.

In FIG. 15, which illustrates a fourth embodiment of the present invention, the transistors 416, 426 and 436 and the line of the signal $\overline{SE}$ of FIG. 12 are omitted, and accordingly, the signal SE2 is supplied directly to the gates of the transistors 418, 428 and 428. In this case, the signal SE2 can be increased to $V_{BOOT}$. Also, the power supply circuits 60, 61 and 62 of FIG. 12 are omitted, and accordingly, the power supply voltage $V_{cc}$ is supplied directly to the drains of the transistors 418, 428 and 438.

The device of FIG. 15 is explained next with reference to FIGS. 16A through 16D. Note that the signals GPDL, $\overline{GPDL}$, LPDL and $\overline{LPDL}$ are changed in the same way as in FIGS. 3A and 3B.

Figures 16A, 16B, 16C, 16D:
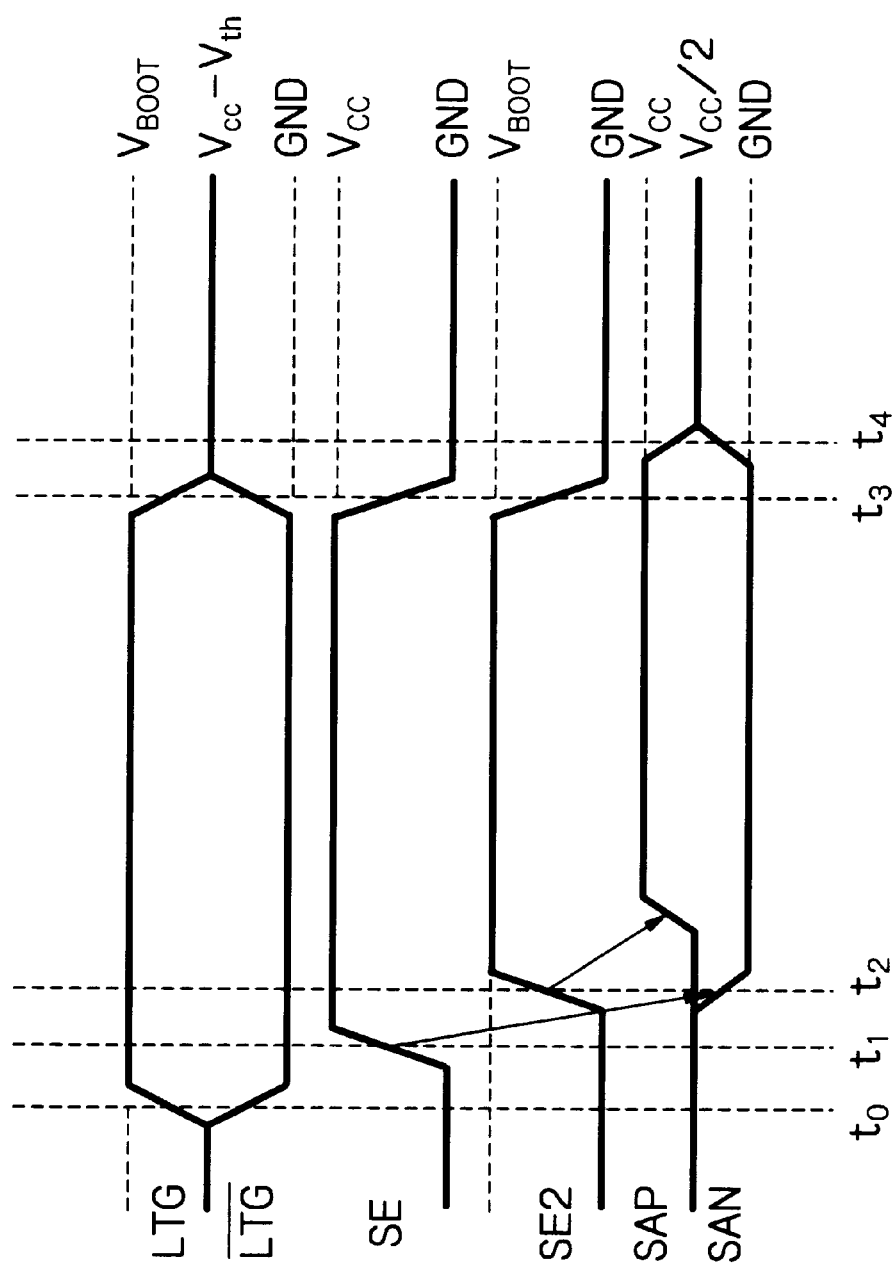
FIGS. 16A through 16D are timing diagrams for showing the operation of the device of FIG. 15.

Assume that the sub word driver columns 10, 11, 12 and 13 on the upper side are selected. Then, at time t0, as shown in FIG. 16A, the signal $\overline{LTG}$ is changed from $V_{cc}-V_{th}$ to the ground voltage GND, so that the N-channel MOS transistors of the transfer gate circuits such as 55 on the lower side are turned OFF. Thus, the non-selected bit lines on the lower side are electrically separated from the sense amplifier columns 30, 31, 32 and 33.

On the other hand, simultaneously, as shown in FIG. 16A, the LTG is changed from $V_{cc}-V_{th}$ to $V_{BOOT}$. As a result, the N-channel MOS transistors of the transfer gate circuits such as 54 are turned ON. Thus, the selected bit lines on the upper side are electrically connected to the sense amplifier columns 30, 31, 32 and 33.

Next, at time t1, as shown in FIG. 16B, the sense enable signal SE rises to turn ON the transistors 411 and 431, to pull down the voltage SAN from $V_{cc}/2$ to the ground voltage GND, thus starting a sense operation, as shown in FIG. 16D.

Next, at time t2, as shown in FIG. 16C, the sense enable signal SE2 rises from GND to $V_{BOOT}$, to turn ON the transistor 418, 428 and 438, to pull up the voltage SAP from $V_{cc}/2$ to the power supply voltage $V_{cc}$, thus starting a restore operation, as shown in FIG. 16D.

Next, at time t3, as shown in FIG. 16A, the signals LTG and $\overline{LTG}$ are precharged at $V_{cc}-V_{th}$, and as shown in FIG. 16B, the sense enable signal SE falls. Also, as shown in FIG. 16C, the signal SE2 falls.

Next, at time t4, as shown in FIG. 16D, the signals SAP and SAN are precharged at $V_{cc}/2$.

Thus, in the fourth embodiment, since the power supply circuits 60, 61 and 62 controlled by the control signals φ1 and φ2 as illustrated in FIG. 12 are unnecessary, the control for the device becomes simple. Also, the driving capability for the signal SAP is about the same in the third embodiment.

Figure 17:
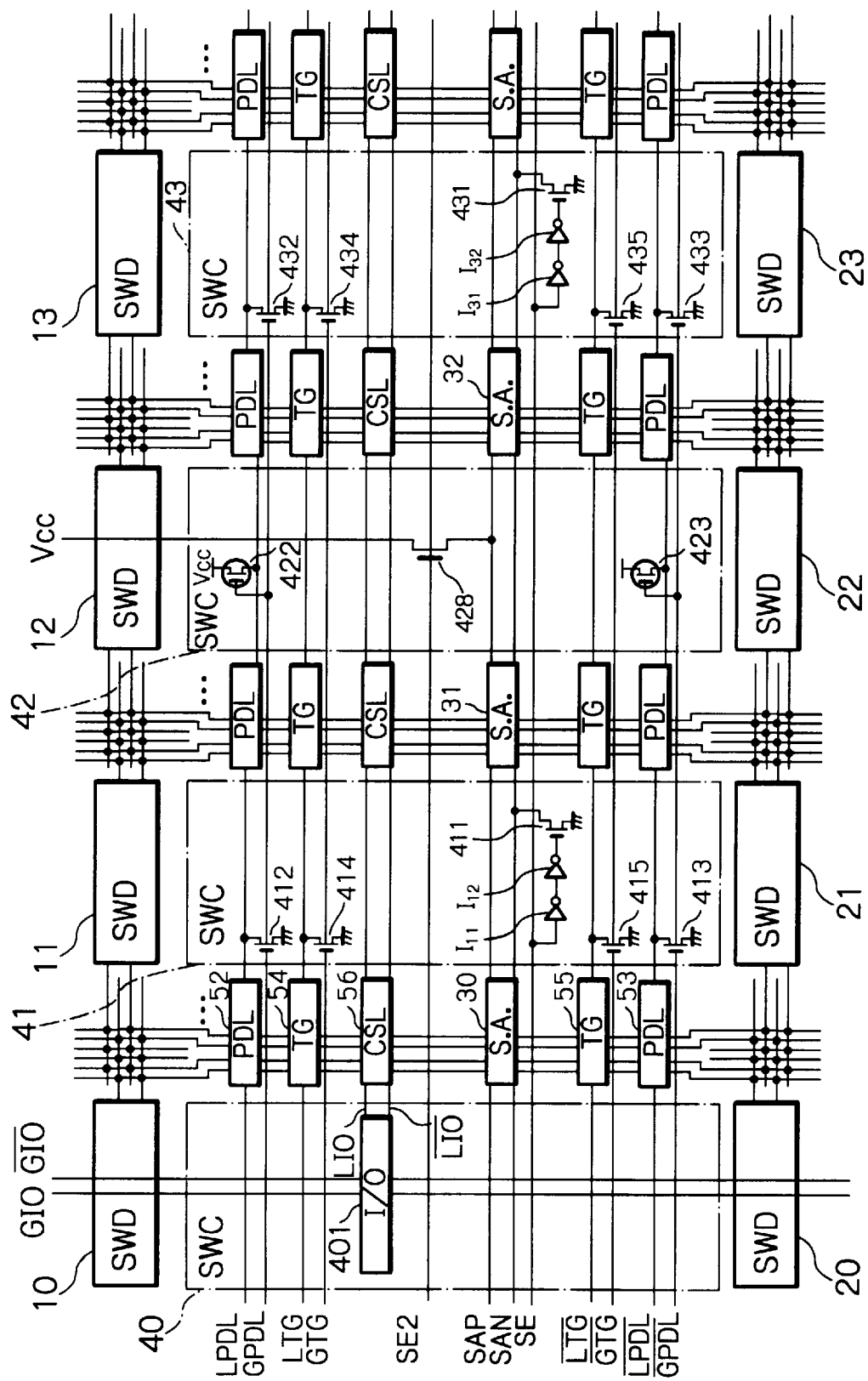
FIG. 17 is a block circuit diagram illustrating a fifth embodiment of the semiconductor memory device according to the present invention.

In FIG. 17, which illustrates a fifth embodiment of the present invention, the transistors 418 and 438 of FIGS. 15 are not provided, since only the transistors 428 has a sufficient driving power. Therefore, the sense amplifier control circuit areas 41 and 42 have room. As a result, in the sense amplifier control circuit area 41 of FIG. 1, two CMOS inverters $I_{11}$ and $I_{12}$ in series are connected between the line of the sense enable signal SE and the gate of the transistor 411. Thus, the load of the sense enable signal SE can be reduced due to the inverters $I_{11}$ and $I_{12}$. Similarly, in the sense amplifier control circuit area 43 of FIG. 1, two CMOS inverters $I_{31}$ and $I_{32}$ in series is connected between the line of the sense enable signal SE and the gate of the transistor 431. Thus, the load of the sense enable signal SE can also be reduced due to the inverters $I_{31}$ and $I_{32}$.

Figure 18:
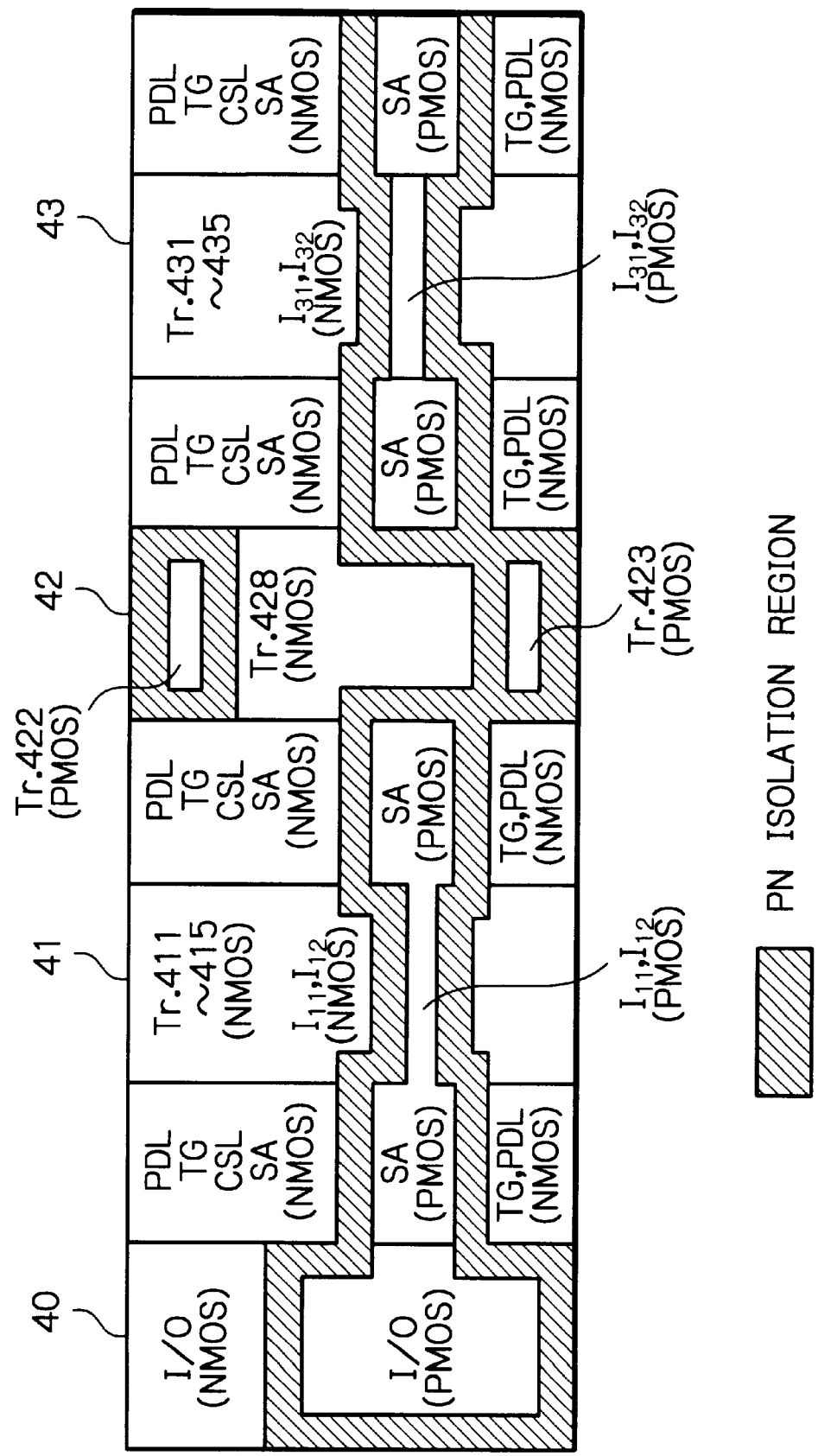
FIG. 18 is a layout diagram of the device of FIG. 17.

In FIG. 18, which is a layout diagram of the device of FIG. 17, all the sense amplifier control circuit areas 40, 41, 42 and 43 are constructed by CMOS circuit areas.

In the above-mentioned embodiments, the sequence of the sense amplifier control circuit areas 40, 41, 42 and 43 can be changed as occasion demands. Also, the power supply voltage $V_{cc}$ as a write voltage can be generated within the device.

As explained hereinabove, since one or more SAP drivers are constructed by N-channel MOS transistors, the restore operation speed by the sense amplifier columns can be enhanced.

We claim:
1. A semiconductor memory device comprising:
   a plurality of sub word lines;
   a plurality of bit lines;
   a plurality of memory cells operatively connected to both said sub word lines and said bit lines;
   a plurality of sub word line driver columns for driving said sub word lines;
   a plurality of sense amplifier columns for sensing voltages at said bit lines; and
   a plurality of sense amplifier control circuits provided at cross areas physically located between said sub word line driver columns and said sense amplifier columns,
   a first one of said sense amplifier control circuits comprising a CMOS circuit forming an interface between global input/output lines and local input/output lines connected to said sense amplifier columns,
   a second one of said sense amplifier control circuits comprising an N-channel MOS circuit forming a pull down circuit for pull down NMOS sources of flip-flops of said sense amplifier columns and a first pull up circuit for pulling up PMOS sources of the flip-flops of said sense amplifier columns,
   a third one of said sense amplifier control circuits comprising a P-channel MOS circuit forming a second pull up circuit for pulling up the PMOS sources of the flip-flops of said sense amplifier columns.

2. The device as set forth in claim 1, wherein said pull down circuit comprises an N-channel MOS transistor having a drain connected to the NMOS sources of the flip-flops of said sense amplifier columns, a source connected to a ground terminal, and a gate for receiving a sense enable signal.

3. The device as set forth in claim 1, wherein said first pull up circuit comprises:

a first N-channel MOS transistor having a drain for receiving a signal from a power supply circuit, a source connected to the PMOS sources of the flip-flops of said sense amplifier columns, and a gate; and a second N-channel MOS transistor having a drain connected to a gate thereof for receiving a signal for connecting said sense amplifier columns to said bit lines, and a source connected to the drain of said first N-channel MOS transistor.

4. The device as set forth in claim 3, wherein said power supply voltage circuit comprises:

a first CMOS switch for passing a write voltage in response to a first control signal; and a second CMOS switch for passing a voltage smaller than said write voltage in response to a second control signal.

5. The device as set forth in claim 1, wherein said first pull up circuit comprises:

a first N-channel MOS transistor having a drain for receiving a signal from a power supply circuit, a source connected to the PMOS sources of the flip-flops of said sense amplifier columns, and a gate;

a second N-channel MOS transistor having a drain connected to a gate thereof for receiving a first signal for connecting said sense amplifier columns to a first group of said bit lines, and a source connected to the drain of said first N-channel MOS transistor;

a third N-channel MOS transistor having a drain for receiving the signal from said power supply circuit, a source connected to the PMOS sources of the flip-flops of said sense amplifier columns, and a gate; and a fourth N-channel MOS transistor having a drain connected to a gate thereof for receiving a second signal for connecting said sense amplifier columns to a second group of said bit lines, and a source connected to the drain of said third N-channel MOS transistor.

6. The device as set forth in claim 5, wherein said power supply voltage circuit comprises:

a first CMOS switch for passing a write voltage in response to a first control signal; and a second CMOS switch for passing a voltage smaller than said write voltage in response to a second control signal.

7. The device as set forth in claim 1, wherein said second pull up circuit comprises a P-channel MOS transistor having a source for receiving a write voltage, a drain connected to the PMOS sources of the flip-flops of said sense amplifier columns, and a gate for receiving a sense enable signal.

8. A semiconductor memory device comprising;
   a plurality of sub word lines;
   a plurality of bit lines;
   a plurality of memory cells operatively connected to both said sub word lines and said bit lines;
   a plurality of sub word line driver columns for driving said sub word lines;
   a plurality of sense amplifier columns for sensing voltages at said bit lines; and
   a plurality of sense amplifier control circuits provided at cross areas physically located between said sub word line driver columns and said sense amplifier columns,
   a first one of said sense amplifier control circuits comprising a CMOS circuit forming an interface between global input/output lines and local input/output lines connected to said sense amplifier columns, a second one of said sense amplifier control circuits comprising an N-channel MOS circuit forming a pull down circuit for pulling down NMOS sources of flip-flops of said sense amplifier columns and a first pull up circuit for pulling up PMOS sources of the flip-flops of said sense amplifier columns, a third one of said sense amplifier control circuits comprising an N-channel MOS circuit forming a second pull up circuit for pulling up the PMOS sources of the flip-flops of said sense amplifier columns.

9. The device as set forth in claim 8, wherein said pull down circuit comprises an N-channel MOS transistor having a drain connected to the NMOS sources of the flip-flops of said sense amplifier columns, a source connected to a ground terminal, and a gate for receiving a sense enable signal.

10. The device as set forth in claim 8, wherein each of said first and second pull up circuits comprises:

a first N-channel MOS transistor having a drain for receiving a signal from a power supply circuit, a source connected to the PMOS sources of the flip-flops of said sense amplifier columns, and a gate; and a second N-channel MOS transistor having a drain connected to a gate thereof for receiving a signal for activating said sense amplifier columns, and a source connected to the drain of said first N-channel MOS transistor.

11. The device as set forth in claim 10, wherein said power supply voltage circuit comprises:

a first CMOS switch for passing a write voltage in response to a first control signal; and a second CMOS switch for passing a voltage smaller than said write voltage in response to a second control signal.

12. The device as set forth in claim 8, wherein each of said first and second pull up circuits comprises an N-channel MOS transistor having a drain for receiving a write voltage, a source connected to the PMOS sources of the flip-flops of said sense amplifier columns, and a gate for receiving a control signal, said control signal being higher than said write voltage by a threshold voltage of said N-channel MOS transistor.

13. A semiconductor memory device comprising:

a plurality of sub word lines;

a plurality of bit lines;

a plurality of memory cells operatively connected to both said sub word lines and said bit lines;

a plurality of sub word line driver columns for driving said sub word lines;

a plurality of sense amplifier columns for sensing voltages at said bit lines; and a plurality of sense amplifier control circuits provided at cross areas physically located between said sub word line driver columns and said sense amplifier columns, a first one of said sense amplifier control circuits comprising a CMOS circuit forming an interface between global input/output lines and local input/output lines connected to said sense amplifier columns, a second one of said sense amplifier control circuits comprising a CMOS circuit forming a pull down circuit for pulling down NMOS sources of flip-flops of said sense amplifier columns, a third one of said sense amplifier control circuits comprising a CMOS circuit forming a pull up circuit for pulling up the PMOS sources of the flip-flops of said sense amplifier columns.

14. The device as set forth in claim 13, wherein said pull down circuit comprises an N-channel MOS transistor having a drain connected to the NMOS sources of the flip-flops of said sense amplifier columns, a source connected to a ground terminal, and a gate; and first and second CMOS inverters, connected inseries to the gate of said N-channel MOS transistor, for receiving a sense enable signal.

15. The device as set forth in claim 13, wherein said pull up circuit comprises a P-channel MOS transistor having a source for receiving a write voltage, a drain connected to the PMOS sources of the flip-flops of said sense amplifier columns, and a gate for receiving a control signal, said control signal being higher than said write voltage by a threshold voltage of said N-channel MOS transistor.

16. A semiconductor memory device comprising:

a plurality of sub word lines;

a plurality of bit lines;

a plurality of memory cells operatively connected to both said sub word lines and said bit lines;

a plurality of sub word line driver columns for driving said sub word lines;

a plurality of sense amplifier columns for sensing voltages at said bit lines; and a plurality of sense amplifier control circuits provided at cross areas physically located between said sub word line driver columns and said sense amplifier columns, a first one of said sense amplifier control circuits comprising an interface between global input/output lines and local input/output lines connected to said sense amplifier columns, a second one of said sense amplifier control circuits comprising a pull down circuit for pull down NMOS sources of flip-flops of said sense amplifier columns and a first pull up circuit for pulling up PMOS sources of the flip-flops of said sense amplifier columns, a third one of said sense amplifier control circuits comprising a second pull up circuit for pulling up the PMOS sources of the flip-flops of said sense amplifier columns.

17. The device as set forth in claim 16, wherein said pull down circuit comprises an N-channel MOS transistor having a drain connected to the NMOS sources of the flip-flops of said sense amplifier columns, a source connected to a ground terminal, and a gate for receiving a sense enable signal.

18. The device as set forth in claim 16, wherein said first pull up circuit comprises:

a first N-channel MOS transistor having a drain for receiving a signal from a power supply circuit, a source connected to the PMOS sources of the flip-flops of said sense amplifier columns, and a gate; and a second N-channel MOS transistor having a drain connected to a gate thereof for receiving a signal for connecting said sense amplifier columns to said bit lines, and a source connected to the drain of said first N-channel MOS transistor.

19. The device as set forth in claim 18, wherein said power supply voltage circuit comprises:

a first CMOS switch for passing a write voltage in response to a first control signal; and a second CMOS switch for passing a voltage smaller than said write voltage in response to a second control signal.

20. The device as set forth in claim 16, wherein said first pull up circuit comprises:

a first N-channel MOS transistor having a drain for receiving a signal from a power supply circuit, a source connected to the PMOS sources of the flip-flops of said sense amplifier columns, and a gate;

a second N-channel MOS transistor having a drain connected to a gate thereof for receiving a first signal for connecting said sense amplifier columns to a first group of said bit lines, and a source connected to the drain of said first N-channel MOS transistor;

a third N-channel MOS transistor having a drain for receiving the signal from said power supply circuit, a source connected to the PMOS sources of the flip-flops of said sense amplifier columns, and a gate; and a fourth N-channel MOS transistor having a drain connected to a gate thereof for receiving a second signal for connecting said sense amplifier columns to a second group of said bit lines, and a source connected to the drain of said third N-channel MOS transistor.

21. The device as set forth in claim 20, wherein said power supply voltage circuit comprises:

a first CMOS switch for passing a write voltage in response to a first control signal; and a second CMOS switch for passing a voltage smaller than said write voltage in response to a second control signal.

22. The device as set forth in claim 16, wherein said second pull up circuit comprises a P-channel MOS transistor having a source for receiving a write voltage, a drain connected to the PMOS sources of the flip-flops of said sense amplifier columns, and a gate for receiving a sense enable signal.

23. The device as set forth in claim 16, wherein each of said first and second pull up circuits comprises:

a first N-channel MOS transistor having a drain for receiving a signal from a power supply circuit, a source connected to the PMOS sources of the flip-flops of said sense amplifier columns, and a gate; and a second N-channel MOS transistor having a drain connected to a gate thereof for receiving a signal for activating said sense amplifier columns, and a source connected to the drain of said first N-channel MOS transistor.

24. The device as set forth in claim 23, wherein said power supply voltage circuit comprises:

a first CMOS switch for passing a write voltage in response to a first control signal; and a second CMOS switch for passing a voltage smaller than said write voltage in response to a second control signal.

25. The device as set forth in claim 16, wherein each of said first and second pull up circuits comprises an N-channel MOS transistor having a drain for receiving a write voltage, a source connected to the PMOS sources of the flip-flops of said sense amplifier columns, and a gate for receiving a control signal, said control signal being higher than said write voltage by a threshold voltage of said N-channel MOS transistor.

26. A semiconductor memory device comprising:

a plurality of sub word lines;

a plurality of bit lines;

a plurality of memory cells operatively connected to both said sub word lines and said bit lines;

a plurality of sub word line driver columns for driving said sub word lines;

a plurality of sense amplifier columns for sensing voltages at said bit lines; and a plurality of sense amplifier control circuits provided at cross areas physically located between said sub word line driver columns and said sense amplifier columns, a first one of said sense amplifier control circuits comprising an interface between global input/output lines and local, input/output lines connected to said sense amplifier columns, a second one of said sense amplifier control circuits comprising a pull down circuit for pulling down NMOS sources of flip-flops of said sense amplifier columns, a third one of said sense amplifier control circuits comprising a pull up circuit for pulling up the PMOS sources of the flip-flops of said sense amplifier columns.

27. The device as set for in claim 26, wherein said pull down circuit comprises an N-channel MOS transistor having a drain connected to the NMOS sources of the flip-flops of said sense amplifier columns, a source connected to a ground terminal, and a gate; and first and second CMOS inverters, connected inseries to the gate of said N-channel MOS transistor, for receiving a sense enable signal.

28. The device as set forth in claim 26, wherein said pull up circuit comprises a P-channel MOS transistor having a source for receiving a write voltage, a drain connected to the PMOS sources of the flip-flops of said sense amplifier columns, and a gate for receiving a control signal, said control signal being higher than said write voltage by a threshold voltage of said N-channel MOS transistor.

* * * * *